US012114089B2

(12) United States Patent
Yan et al.

(10) Patent No.: US 12,114,089 B2
(45) Date of Patent: Oct. 8, 2024

(54) PIXEL OUTPUT PARASITIC CAPACITANCE REDUCTION AND PREDICTIVE SETTLING ASSIST

(71) Applicant: Apple Inc., Cupertino, CA (US)

(72) Inventors: Hai Yan, San Ramon, CA (US); Chiajen Lee, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 7 days.

(21) Appl. No.: 17/891,963

(22) Filed: Aug. 19, 2022

(65) Prior Publication Data

US 2024/0064432 A1 Feb. 22, 2024

(51) Int. Cl.
| H01L 27/146 | (2006.01) |
| H04N 25/75 | (2023.01) |
| H04N 25/77 | (2023.01) |

(52) U.S. Cl.
CPC ....... *H04N 25/77* (2023.01); *H01L 27/14636* (2013.01); *H04N 25/75* (2023.01)

(58) Field of Classification Search
CPC ... H04N 25/77; H04N 25/75; H01L 27/14636
See application file for complete search history.

(56) References Cited

U.S. PATENT DOCUMENTS

| 6,476,783 B2 | 11/2002 | Matthies et al. |
| 7,349,574 B1 | 3/2008 | Sodini et al. |
| 8,111,306 B2 | 2/2012 | Kuruma et al. |
| 8,128,890 B2 | 5/2012 | Droog |
| 8,497,460 B2 * | 7/2013 | Nakayama ........... H04N 25/778 250/214 R |
| 8,792,020 B2 | 7/2014 | Lee et al. |
| 8,957,358 B2 | 2/2015 | Wan et al. |
| 8,963,886 B2 | 2/2015 | Wassvik |
| 8,975,752 B2 | 3/2015 | Chow et al. |
| 9,312,294 B2 | 4/2016 | Chuang et al. |
| 9,349,035 B1 | 5/2016 | Gerber |

(Continued)

FOREIGN PATENT DOCUMENTS

| CN | 105229788 | 1/2016 |
| CN | 106104565 | 11/2016 |

(Continued)

OTHER PUBLICATIONS

Charlet et al., "Chip-to-chip interconnections based on the wireless capacitive coupling for 3D integration," *Microelectronic Engineering*, vol. 83, 2006, pp. 2195-2199.

(Continued)

*Primary Examiner* — Ahmed A Berhan
(74) *Attorney, Agent, or Firm* — Brownstein Hyatt Farber Schreck, LLP

(57) ABSTRACT

Disclosed herein are electronic devices and image sensors containing pixel arrays, layouts of electrical signal lines for such pixel arrays, and methods of pixel read out operations, including row read operations, for such pixel arrays. Layouts are disclosed that have reduced sets of shielding or ground lines. In some layouts, shielding ground lines are used only between pairs of adjacent pixel output signal lines (OSLs). Also disclosed is a method of using one OSL within a pair of adjacent pixel OSLs to provide settling assist of the pixel output signal on the other OSL of the adjacent pair of OSLs.

20 Claims, 12 Drawing Sheets

(56) References Cited

U.S. PATENT DOCUMENTS

| | | |
|---|---|---|
| 9,362,320 B2 | 6/2016 | Yamashita et al. |
| 9,372,283 B2 | 6/2016 | Nikoobakht |
| 9,437,132 B2 | 9/2016 | Rappoport et al. |
| 9,445,026 B2 | 9/2016 | Kobayashi et al. |
| 9,594,476 B2 | 3/2017 | Yang et al. |
| 9,720,535 B2 | 8/2017 | Yang et al. |
| 9,860,467 B2 | 1/2018 | Kim et al. |
| 10,026,771 B1 | 7/2018 | Lee et al. |
| 10,042,467 B2 | 8/2018 | Schwartz et al. |
| 10,146,258 B2 | 12/2018 | Sinha et al. |
| 10,181,070 B2 | 1/2019 | Smith et al. |
| 10,205,898 B2 | 2/2019 | McMahon et al. |
| 10,360,431 B2 | 7/2019 | Gozzini et al. |
| 10,394,014 B2 | 8/2019 | Sakai |
| 10,635,878 B2 | 4/2020 | Yi et al. |
| 10,658,404 B2 | 5/2020 | Abe et al. |
| 10,685,202 B2 | 6/2020 | Kim et al. |
| 10,713,458 B2 | 7/2020 | Bhat et al. |
| 10,733,408 B2 | 8/2020 | Bok |
| 10,733,931 B2 | 8/2020 | Jung et al. |
| 10,739,807 B2 | 8/2020 | Lallement et al. |
| 10,838,126 B2 | 11/2020 | Wang et al. |
| 10,868,064 B2 * | 12/2020 | Wada .................... H04N 25/75 |
| 11,073,712 B2 | 7/2021 | Yeke Yazdandoost et al. |
| 11,121,165 B2 | 9/2021 | Lee et al. |
| 11,177,311 B2 * | 11/2021 | Juen ...................... H01L 27/146 |
| 11,619,857 B2 | 4/2023 | Li et al. |
| 2005/0002448 A1 | 1/2005 | Knight et al. |
| 2005/0174335 A1 | 8/2005 | Kent et al. |
| 2008/0054320 A1 | 3/2008 | Solhusvik et al. |
| 2010/0045364 A1 | 2/2010 | Law et al. |
| 2011/0115041 A1 | 5/2011 | Dan et al. |
| 2012/0262408 A1 | 10/2012 | Pasquero et al. |
| 2014/0133715 A1 | 5/2014 | Ballard et al. |
| 2015/0177884 A1 | 6/2015 | Han |
| 2015/0177979 A1 | 6/2015 | Johansson et al. |
| 2016/0163753 A1 | 6/2016 | Yu et al. |
| 2018/0074627 A1 | 3/2018 | Kong et al. |
| 2018/0358393 A1 | 12/2018 | Sato et al. |
| 2021/0240026 A1 | 8/2021 | Yeke Yazdandoost et al. |
| 2021/0311240 A1 | 10/2021 | Siddique et al. |
| 2022/0115428 A1 | 4/2022 | Borremans |
| 2022/0272291 A1 | 8/2022 | Mas et al. |
| 2023/0236469 A1 | 7/2023 | Li et al. |

FOREIGN PATENT DOCUMENTS

| | | |
|---|---|---|
| CN | 106298856 | 1/2017 |
| CN | 107004130 | 8/2017 |
| CN | 107870689 | 4/2018 |
| JP | 2009042870 | 2/2009 |
| KR | 1020170113066 | 10/2017 |
| WO | WO 20/052607 | 5/2010 |
| WO | WO 15/005959 | 1/2015 |
| WO | WO 15/191557 | 12/2015 |
| WO | WO 18/040512 | 3/2018 |
| WO | WO 22/061016 | 3/2022 |

OTHER PUBLICATIONS

Neubrech et al Science Advances 2020, vol. 6: eabc2709, Sep. 4, 2020, 21 pages.

Han et al., "Deep Trench Isolation and Inverted Pyramid Array Structures Used to Enhance Optical Efficiency of Photodiode in CMOS Image Sensor via Simulations," Sensors, vol. 20, No. 3062, 2020, pp. 1-14.

* cited by examiner

PIXEL OUTPUT PARASITIC CAPACITANCE REDUCTION AND PREDICTIVE SETTLING ASSIST

FIELD

The present disclosure generally relates to image or other sensors that include an array of light-gathering pixels, such as may be found in cameras of smart phones, robotic equipment, or cameras of security monitors, among others. This disclosure also generally relates to electrical connections of such pixel arrays and signaling methods over such electrical connections.

BACKGROUND

Electronic devices may include light-gathering sensors, such as image sensors in a camera, that in turn may include one or more arrays of pixels. Examples of such electronic devices include cell phones, tablet computers, personal digital assistants, security camera devices, and remotely operated equipment, among others.

Such arrays of pixels (or just "pixel arrays") may include columns of pixels connected to output signal lines (OSLs). The pixel arrays may have ground lines interspersed with the OSLs for shielding and/or substrate connection purposes.

SUMMARY

This summary is provided to introduce a selection of concepts in a simplified form that are further described in the Detailed Description section. This summary is not intended to identify key features or essential features of the claimed subject matter, nor is it intended to be used as an aid in determining the scope of the claimed subject matter.

Disclosed herein are electronic devices, image sensors, their various component systems and subsystems, and methods of their operation. The electronic devices, image sensors, or their various component systems and subsystems, may contain a light-sensing pixel array.

More specifically, described herein, in some embodiments, is a method of performing a row read operation of a pixel array of an image sensor that includes a set of electrical signal lines associated with a pair of pixel columns of the pixel array. The associated electrical signal lines associated with the pair of pixel columns may be positioned with or between the pair of pixel columns. The electrical signal lines include a first and a second pair of adjacent output signal lines (OSLs), a ground line interposed between the first pixel column and the first pair of adjacent OSLs, a ground line interposed between the first pair of adjacent OSLs and the second pair of adjacent OSLs, and a ground line interposed between the second pair of adjacent OSLs and the second pixel column. The row read operation includes applying an initial voltage to a first OSL of the first pair of adjacent OSLs and subsequently configuring a voltage of the first OSL of the first pair of adjacent OSLs to float. While the voltage of the first OSL of the first pair of adjacent OSLs floats, a signal transfer pulse is applied to a first pixel of the first pixel column. A pixel output signal of the first pixel of the first pixel column is received on a second OSL of the first pair of adjacent OSLs. A low voltage signal is applied to the first OSL of the first pair of adjacent OSLs during a pull-down time interval containing a falling edge of the signal transfer pulse.

Also described herein, and in some embodiments, is an electronic device that includes a pixel array and an electronic control system operably linked with the pixel array. The pixel array includes a first pixel column and a second pixel column adjacent to the first pixel column, and a set of electrical signal lines positioned with or between the first and second pixel columns. The electrical signal lines include: a first pair of adjacent output signal lines (OSLs), a second pair of adjacent OSLs positioned with or between the first pair of adjacent OSLs and the second pixel column, a first ground line positioned with or between the first pixel column and the first pair of adjacent OSLs, a second ground line interposed between the first pair of adjacent OSLs and the second pair of adjacent OSLs, and a third ground line positioned with or between the second pair of adjacent OSLs and the second pixel column. The electronic control system is operable to apply a row read operation to the pixel array. The row read operation includes applying an initial voltage value to a first OSL of the first pair of adjacent OSLs; applying a signal transfer pulse to a pixel in the first pixel column; receiving on a second OSL of the first pair of adjacent OSLs a pixel output signal of the pixel in the first pixel column; and applying a low voltage pulse to the first OSL of the first pair of adjacent OSLs during a pull-down time interval containing the falling edge of the signal transfer pulse.

Also described herein, and in some embodiments, is an image sensor including a pixel array and an electronic control system. The pixel array includes a first column of pixels, a second column of pixels adjacent to the first column of pixels, and a set of electrical signal lines positioned with or between the first column of pixels and the second column of pixels and extending parallel to the first column of pixels. The electrical signal lines include: four pairs of adjacent output signal lines (OSLs); a first ground line positioned with or between the first column of pixels and a first pair of adjacent OSLs; a second ground line interposed between the first pair of adjacent OSLs and a second pair of adjacent OSLs; a third ground line interposed between the second pair of OSLs and a third pair of adjacent OSLs; a fourth ground line interposed between the third pair of OSLs and a fourth pair of adjacent OSLs; and a fifth ground line positioned with or between the fourth pair of adjacent OSLs and the second column of pixels. The electronic control system is linked with the electrical signal lines of the pixel array and configured to selectively float or bias a first OSL in a pair of adjacent OSLs while receiving a pixel output signal on a second OSL in the pair of adjacent OSLs.

BRIEF DESCRIPTION OF THE DRAWINGS

The disclosure will be readily understood by the following detailed description in conjunction with the accompanying drawings, wherein like reference numerals designate like structural elements.

Figure 1A:
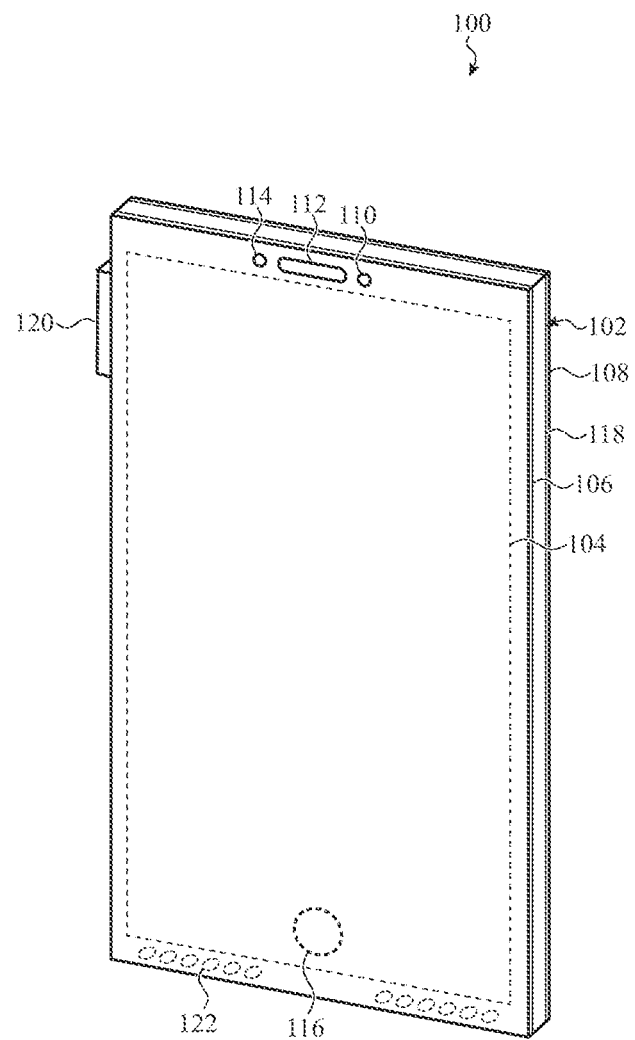
FIGS. 1A and 1B show an example of an electronic device that may include an illumination projector.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to electronic devices, including but not limited to image sensors, that contain one or more arrays of light gathering picture elements (or just 'pixels' of 'pixel arrays'). In such pixel arrays, each pixel may contain one or more light sensitive semiconductor elements, such as photodiodes or avalanche diodes, that receive light and convert it to an electric charge from which an electrical signal may be generated. Pixel arrays are often, but not necessarily, configured as a rectangular array of M columns and N rows, for integers M and N, which may be large (e.g., on the order of millions of pixels). Herein, two columns of pixels of a pixel array are said to be 'adjacent' if there are no other intervening pixels, though there may be various intervening electrical connection lines.

The electronic devices may also contain various electronic components (such as oscillators and timing elements, row or column select transistors or circuits, comparators, buffers and amplifiers, analog-to-digital and digital-to-analog converters, various processors, etc.) that may form one or more electronic control or logic (sub)systems that may control operations related to the reception of the light by the pixels, or to the transmission or processing of the electrical signals arising from light-generated charges in the pixels. Electrical signals produced by, or received from, a pixel, such as signals related to light-generated charges during an image exposure, are termed herein "pixel output signals."

Pixel arrays and associated electronic control systems of an image sensor may be implemented on a single semiconductor wafer or 'chip.' Alternatively, each may be implemented on separate chips that are then joined by a 'flip chip' process, with electrical connections between the chips implemented by conductive paths or vias extending to the connecting interface surfaces of the two chips. An example of the latter case is used in 'backside illuminated' fabrication techniques for pixel arrays, in which the semiconductor structures of the pixels for the pixel array are first formed on a substrate, followed by fabrication (such as epitaxial deposition) of connection lines and/or associated electronic components above the pixel array. The pixel array is removed from the substrate and joined, on the chip side opposite to the pixel array, to the electronic control chip so that the pixel array faces a direction of incoming light.

Such pixel arrays may include multiple electrical connections, such as voltage supply lines, timing input lines, and internal component connection lines, among others. Also, the pixel arrays may contain output signal lines (OSLs) by which the electrical pixel output signals of the pixels of the pixel array are transmitted to other components of the electronic device for processing. The pixel arrays also contain ground lines, which may be held at low or zero voltage. The ground lines can provide the low or zero voltage electrical connection for the various electronic components. Also, the ground lines can provide electrical shielding to reduce interference between voltages of the electronic components and to reduce interference or noise between output signal lines.

In some pixel arrays, certain of the ground lines and OSLs (and possibly other signal lines) may be positioned parallel to the pixel columns, and positioned either below or atop a pixel column, or in a pixel-free region between adjacent columns of pixels. There may be a dielectric or other shielding layer positioned between a pixel column and any such ground line or OSL positioned below or atop the pixel column. Herein, a set of OSLs or ground lines positioned either below or atop a column of two adjacent columns of pixels, or in a pixel-free region between the two adjacent columns of pixels, and parallel to the two adjacent columns of pixels, are said to be "positioned with or between" the two adjacent pixel columns. Herein, a ground line, OSL, or pair of OSLs, is said to be "interposed between" any two of the ground lines, OSLs, or pixel columns if those two are disposed on opposite sides of that ground line, OSL, or pair of OSLs, whether that ground line, OSL, or pair of OSLs is below, atop or to the side of a pixel column. Such a structure may allow, after an image capture exposure, for pixel output signals of pixels across one or more rows to be received simultaneously onto the OSLs positioned with or between the columns of pixels. Herein, such a procedure will be termed a "row read operation."

The ground lines, when placed in proximity to an OSL, may introduce a stray capacitance between the two lines. Such a capacitance between the two lines may reduce the transmission speed of the output signal. Also, such as in the case of a pulsed pixel output signal, the capacitance may slow a return to low voltage on the OSL at the conclusion of the pulsed output signal.

Various embodiments described herein relate to using a reduced number of ground lines in a set of electrical signal lines positioned with or between adjacent columns of a pixel array. Such a reduction may result in a decrease of the stray capacitances on the pixel array. Also, such a reduction of ground lines may allow for greater separation between the totality of OSLs and ground lines, which may also decrease the stray capacitances. The reduction of the number of ground lines may also decrease the complexity of fabrication of the pixel arrays.

In some embodiments, ground lines may be omitted between two OSLs to form an adjacent pair of OSLs. In such embodiments, during a row read operation not all OSLs may be used to carry pixel output signals. Within such a pair of adjacent OSLs, a first OSL may receive (or "carry") a pixel output signal, while the second OSL of the adjacent pair, unused for carrying a pixel output signal, may instead be used to reduce the associated settling time (such as of a voltage) of the first OSL at the conclusion of the pixel output signal. In one embodiment, the second OSL is initially placed at either a floating or high voltage level prior to the initiation of transmission of the pixel output signal onto the first OSL. At or near the conclusion of the transmission of the pixel output signal onto the first OSL, a low voltage pulse is applied to the second OSL. After application of the low voltage pulse, the second OSL may be allowed to have a floating voltage, or may be kept at a low voltage.

These and other embodiments are discussed below with reference to FIGS. 1A-8. However, those skilled in the art will readily appreciate that the detailed description given herein with respect to these Figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described herein. Because components in various embodiments can be positioned in a number of different orientations, directional terminology is used for purposes of illustration and is not always limiting. Directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or one of any combination of the items, and/or one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

Figure 1B:
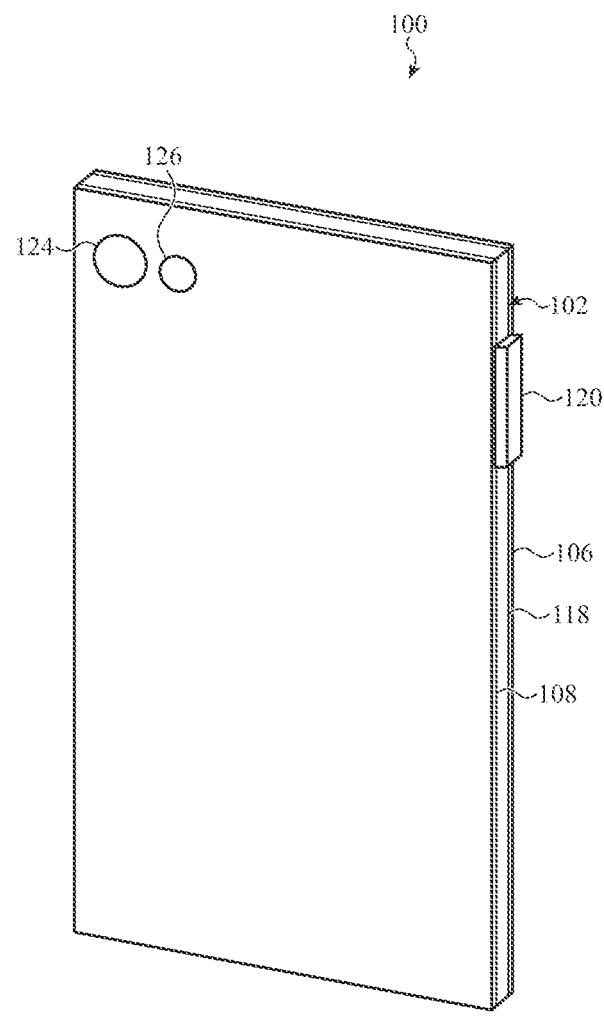

FIGS. 1A and 1B show an example of a device 100 that may include an illumination projector. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example a mobile phone, tablet computer, portable computer, portable music player, wearable device (e.g., an electronic watch, health monitoring device, or fitness tracking device), augmented reality (AR) device, virtual reality (VR) device, mixed reality (MR) device, gaming device, portable terminal, digital single-lens reflex (DSLR) camera, video camera, vehicle navigation system, robot navigation system, or other portable or mobile device. The device 100 could also be a device that is semi-permanently located (or installed) at a single location. FIG. 1A shows a front isometric view of the device 100, and FIG. 1B shows a back isometric view of the device 100. The device 100 may include a housing 102 that at least partially surrounds a display 104. The housing 102 may include or support a front cover 106 that defines a front surface of the device 100, and/or a back cover 108 that defines a back surface of the device 100 (with the back surface opposite the front surface). More generically, the device 100 may include one or more "covers." The front cover 106 may be positioned over the display 104, and may provide a window through which the display 104 may be viewed. In some embodiments, the display 104 may be attached to (or abut) the housing 102 and/or the front cover 106. In alternative embodiments of the device 100, the display 104 may not be included and/or the housing 102 may have an alternative configuration.

The display 104 may include one or more light-emitting elements, and in some cases may be a light-emitting diode (LED) display, an organic LED (OLED) display, a liquid crystal display (LCD), an electroluminescent (EL) display, or another type of display. In some embodiments, the display 104 may include, or be associated with, one or more touch and/or force sensors that are configured to detect a touch and/or a force applied to a surface of the front cover 106.

The various components of the housing 102 may be formed from the same or different materials. For example, a sidewall 118 of the housing 102 may be formed using one or more metals (e.g., stainless steel), polymers (e.g., plastics), ceramics, or composites (e.g., carbon fiber). In some cases, the sidewall 118 may be a multi-segment sidewall including a set of antennas. The antennas may form structural components of the sidewall 118. The antennas may be structurally coupled (to one another or to other components) and electrically isolated (from each other or from other components) by one or more non-conductive segments of the sidewall 118. The front cover 106 may be formed, for example, using one or more of glass, a crystal (e.g., sapphire), or a transparent polymer (e.g., plastic) that enables a user to view the display 104 through the front cover 106. In some cases, a portion of the front cover 106 (e.g., a perimeter portion of the front cover 106) may be coated with an opaque ink to obscure components included within the housing 102. The back cover 108 may be formed using the same material(s) that are used to form the sidewall 118 or the front cover 106. In some cases, the back cover 108 may be part of a monolithic element that also forms the sidewall 118 (or in cases where the sidewall 118 is a multi-segment sidewall, those portions of the sidewall 118 that are conductive or non-conductive). In still other embodiments, all of the exterior components of the housing 102 may be formed from a transparent material, and components within the device 100 may or may not be obscured by an opaque ink or opaque structure within the housing 102.

The front cover 106 may be mounted to the sidewall 118 to cover an opening defined by the sidewall 118 (i.e., an opening into an interior volume, in which various electronic components of the device 100, including the display 104, may be positioned). The front cover 106 may be mounted to the sidewall 118 using fasteners, adhesives, seals, gaskets, or other components.

A display stack or device stack (hereafter referred to as a "stack") including the display 104 may be attached (or abutted) to an interior surface of the front cover 106 and extend into the interior volume of the device 100. In some cases, the stack may include a touch sensor (e.g., a grid of capacitive, resistive, strain-based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 106 (e.g., to a display surface of the device 100).

In some cases, a force sensor (or part of a force sensor system) may be positioned within the interior volume above, below, and/or to the side of the display 104 (and in some cases within the device stack). The force sensor (or force sensor system) may be triggered in response to the touch sensor detecting one or more touches on the front cover 106 (or a location or locations of one or more touches on the front cover 106), and may determine an amount of force associated with each touch, or an amount of force associated with a collection of touches as a whole. In some embodiments, the force sensor (or force sensor system) may be used to determine a location of a touch, or a location of a touch in combination with an amount of force of the touch. In these latter embodiments, the device 100 may not include a separate touch sensor.

As shown primarily in FIG. 1A, the device 100 may include various other components. For example, the front of the device 100 may include one or more front-facing cameras 110, speakers 112, microphones, or other components 114 (e.g., audio, imaging, and/or sensing components) that are configured to transmit or receive signals to/from the device 100. In some cases, a front-facing camera 110, alone or in combination with other sensors, may be configured to operate as a bio-authentication or facial recognition sensor. The device 100 may also include various input devices, including a mechanical or virtual button 116, which may be accessible from the front surface (or display surface) of the device 100. In some embodiments, a virtual button 116 may be displayed on the display 104 and, in some cases, a fingerprint sensor may be positioned under the button 116 and configured to image a fingerprint through the display 104. In some embodiments, the fingerprint sensor or another form of imaging device may span a greater portion, or all, of the display area.

The device 100 may also include buttons or other input devices positioned along the sidewall 118 and/or on a back surface of the device 100. For example, a volume button or multipurpose button 120 may be positioned along the sidewall 118, and in some cases may extend through an aperture in the sidewall 118. In other embodiments, the button 120 may take the form of a designated and possibly raised portion of the sidewall 118, but the button 120 may not extend through an aperture in the sidewall 118. The sidewall 118 may include one or more ports 122 that allow air, but not liquids, to flow into and out of the device 100. In some embodiments, one or more sensors may be positioned in or near the port(s) 122. For example, an ambient pressure sensor, ambient temperature sensor, internal/external differential pressure sensor, gas sensor, particulate matter concentration sensor, or air quality sensor may be positioned in or near a port 122.

In some embodiments, the back surface of the device 100 may include a rear-facing camera 124 that includes one or more image sensors (see FIG. 1B). A flash or light source 126 may also be positioned on the back of the device 100 (e.g., near the rear-facing camera). In some cases, the back surface of the device 100 may include multiple rear-facing cameras.

Figure 2A:
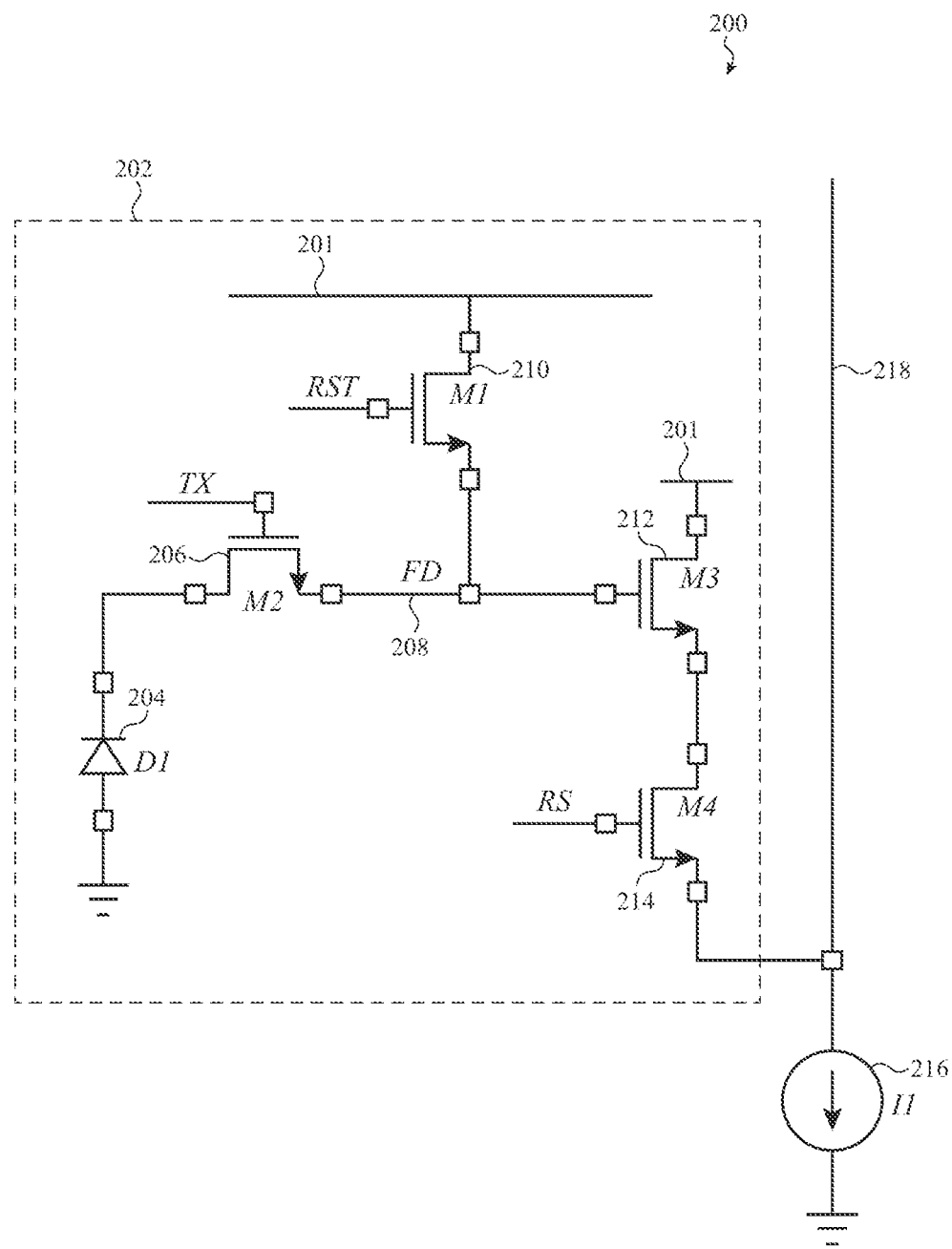
FIG. 2A illustrates a layout of circuit elements of a pixel, according to an embodiment.

FIG. 2A illustrates a configuration 200 of example electrical components of a pixel 202. The pixel 202 may be part of a pixel array as described herein, which in turn may be part of an image sensor in the device 100, or in another electronic device. The configuration 200 is exemplary; in the pixel arrays of the embodiments disclosed below, the pixels of those pixel arrays may by implemented with alternative configurations of internal electrical components.

The pixel 202 is connected to a voltage supply 201 that connects to the drain of a reset (RST) transistor M1 210. The pixel 202 includes a photodiode D1 204 that connects to the source of a transmit (TX) transistor M2 206. The drain of the transmit transistor 206 is connected to a floating diffusion (FD) node 208. The FD node 208 is connected to the source of the RST transistor 210 and to the gate of the output transistor M3 212. The drain of the output transistor 212 connects to the voltage supply 201, and its source connects to the drain of a row select (RS) transistor M4 214. The source of the RS transistor 214 connects to an output signal line (OSL) 218. A current source I1 216 may buffer the output signal from the pixel 202 on the OSL 218. The current source 216 may be separate from the pixel as shown, or implemented in the pixel itself.

Figure 2B:
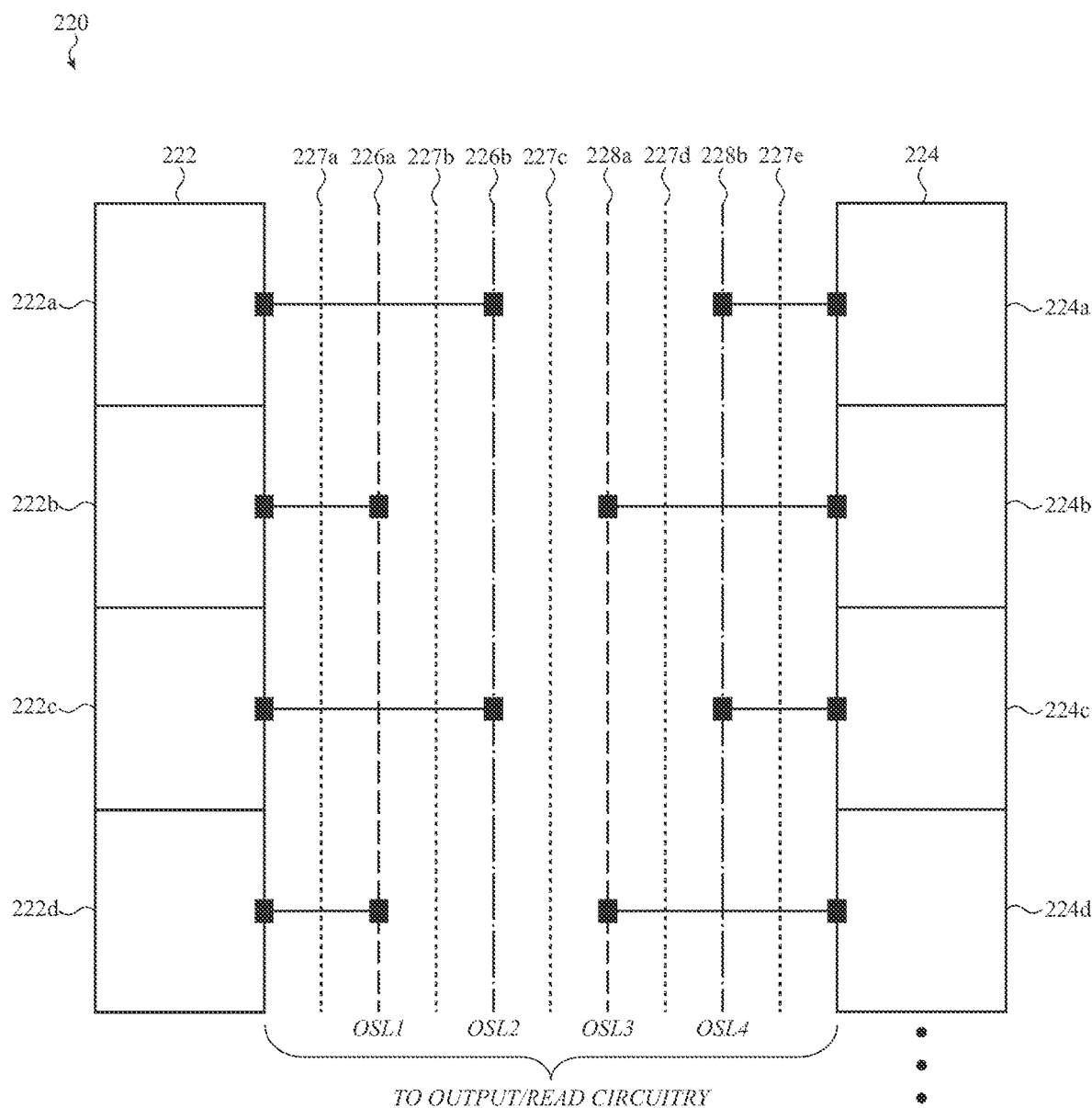
FIG. 2B illustrates a layout of electrical connections positioned with or between columns of pixels.

FIG. 2B shows a configuration 220 of a section of a pixel array that may be part of an image sensor. The pixel array may have N rows (the horizontal direction in FIG. 2B) and M columns (the vertical direction in FIG. 2B), for M and N positive integers. In the shown section of the pixel array, the left column of pixels 222 contains the pixels 222a, 222b, 222c, and 222d. In the shown section of the pixel array, the right column of pixels 224 contains the pixels 224a, 224b, 224c, and 224d. Some or all of the pixels 222a-d and 224a-d may have the configuration of the pixel 202 of FIG. 2A, or an alternative configuration.

As shown in the configuration 220, there is a set of electrical signal lines 226a, 226b, 227a, 227b, 227c, 227d, 227e, 228a, and 228b positioned with or between the left column of pixels 222 and right column of pixels 224, and extending parallel to the direction of the left and right columns of pixels 222 and 224. For clarity of FIG. 2B and simplicity of presentation, the electrical signal lines 226a, 226b, 227a, 227b, 227c, 227d, 227e, 228a, and 228b are shown positioned between the left and right column of pixels 222 and 224. However, as stated previously, at least some of these electrical signal lines may be positioned atop or below either of the columns of pixels 222 and 224. The pixel array may include other electrical signal or connection lines that are not shown, such as, but not limited to, horizontally positioned row select connection lines. Herein, two electrical signal lines of any types are said to be adjacent if there are no other electrical signal lines or pixels between them.

The set of electrical signal lines includes the output signal line (OSL) 226a connected to receive pixel output signals from the pixels 222b and of the left column of pixels 222, and the OSL 226b connected to receive pixel output signals from the pixels 222a and 222c of the left column of pixels 222. Similarly, the set of electrical signal lines includes the OSL 228a connected to receive the pixel output signals of the pixels 224b and 224d of the right column of pixels 224, and OSL 228b connected to receive the pixel output signals of the pixels 224a and 224c of the right column of pixels 224. In the configuration 220, the set of electrical signal lines also includes the ground lines 227a, 227b, 227c, 227d and 227e that alternate with the OSLs 226a-b and 228a-b. The ground lines 227a-e may be at a low voltage. The OSLs 226a-b, the OSLs 228a-b, and the ground lines 227a-e may connect to output/read circuitry (not shown), which may be part of an electrical control system (or subsystems) of an electronic device, such as electronic device 100. 224d of the right column of pixels 224. In the configuration 220, the set of electrical signal lines also includes the ground lines 227a, 227b, 227c, 227d and 227e that alternate with the OSLs 226a-b and 228a-b. The ground lines 227a-e may be at a low voltage. The OSLs 226a-b, the OSLs 228a-b, and the ground lines 227a-e may connect to output/read circuitry (not shown), which may be part of an electrical control system (or subsystems) of an electronic device, such as electronic device 100.

Figure 2C:
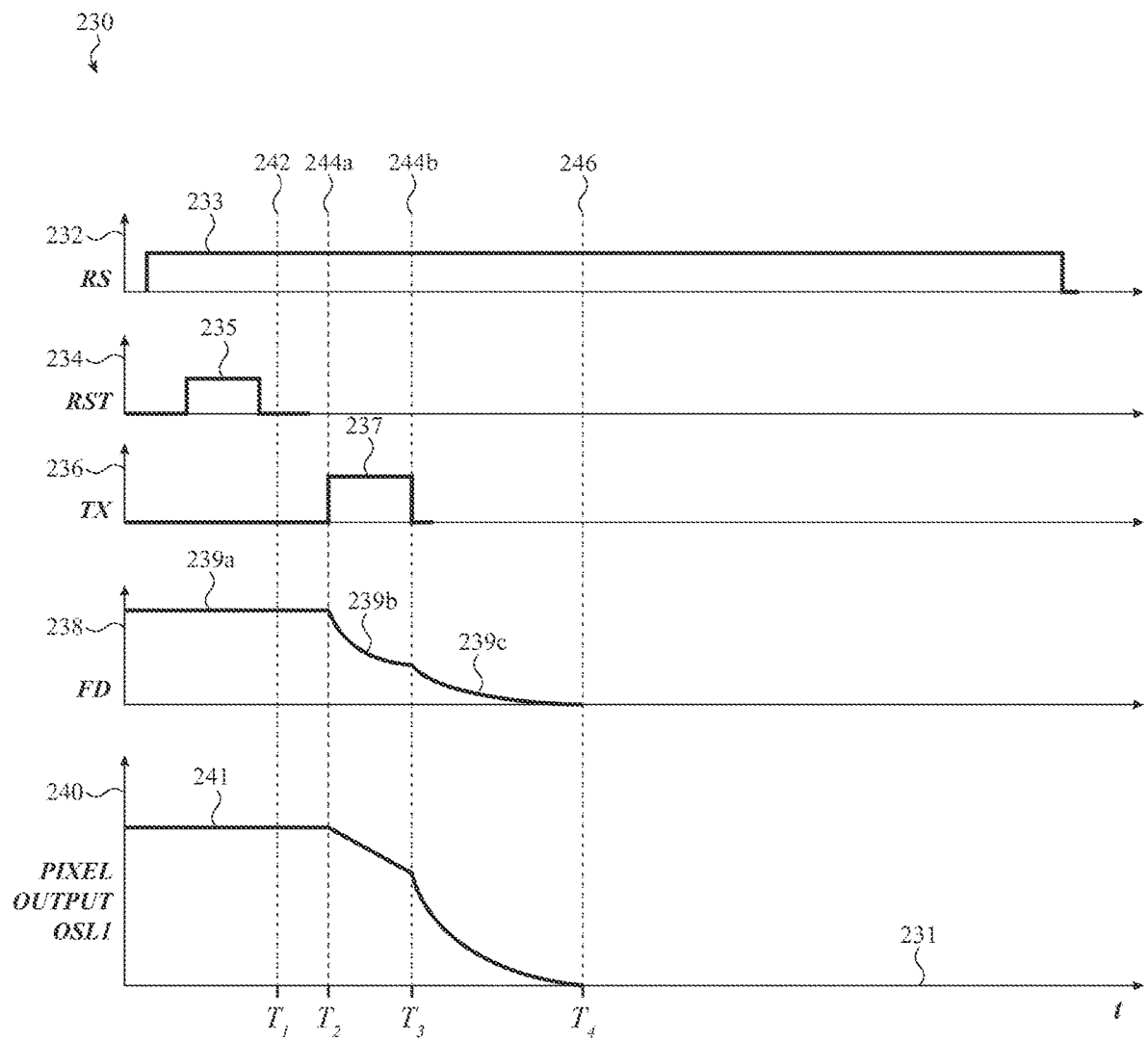
FIG. 2C illustrates a timing diagram of electrical signals that may be applied to, or received from, the pixel of FIG. 2A.

FIG. 2C shows a timing diagram 230 of signals that may be applied to, or received from, the pixel 202 of FIG. 2A during a pixel read operation, such as may occur in a row read operation. The ground lines 227a-e may be at a low voltage during the pixel read operation. After an exposure time in which the photodiode D1 204 has acquired light-generated charge, the pixel read operation of the pixel 202 may begin with a row select (RS) signal 233 applied to enable the RS transistor 214, as shown on the first timing graph 232. After the start of the RS signal 233, a reset (RST) pulse signal 235 is applied to the RST transistor 210 to reset the FD node 208, as shown on the RST timing graph 234. The RST pulse signal 235 can reset the FD node voltage to provide a clean reference for a first analog-to-digital conversion (ADC). The reset voltage 239a of the FD node 208 is then transmitted through an RS transistor (such as RS transistor 214 of FIG. 2A) onto the OSL 218. A first ADC may be performed by output/read circuitry exterior to the pixel 202; for example, in electronic control or logic systems of the electronic device. The first ADC may be performed in the time interval from the time $T_1$ 242 to the time $T_2$ 244a as shown on the time axis 231.

After the first ADC, a transfer (TX) pulse 237 is applied to the transmit transistor 206 starting at time $T_2$ 244a to transfer charge acquired by the photodiode 204 during the exposure to the FD node 208, as shown on the third timing graph 236. As shown in the fourth timing diagram 238, the voltage 239b begins to fall at the FD node 208 during the application of the TX pulse 237, which has a falling edge at time $T_3$ 244b. The fifth timing graph 240 shows the voltage on the OSL 218 during the pixel read operation. After a time $T_4$ 246, the voltage 239c at the FD node 208 and the pixel output signal 241 on OSL 218 have both settled to a point at which a second ADC may be performed. The amount of light-generated charges may then be estimated based on the first and second ADCs.

In the configuration 220 of the pixel array shown in FIG. 2B, a parallel row read operation using the signals analogous to those described in relation to FIG. 2C may be performed concurrently that uses all four OSLs 226a, 226b, 228a and 228b. For example, a first row select signal, such as the RS signal 233, may be applied concurrently to both the pixels 222a and 224a, and concurrently with a second row select signal, such as RS signal 233, applied to both the pixels 222b and 224b. The outputs of pixels 222b and 224b are received onto the respective OSLs 226a and 228a.

Figure 3:
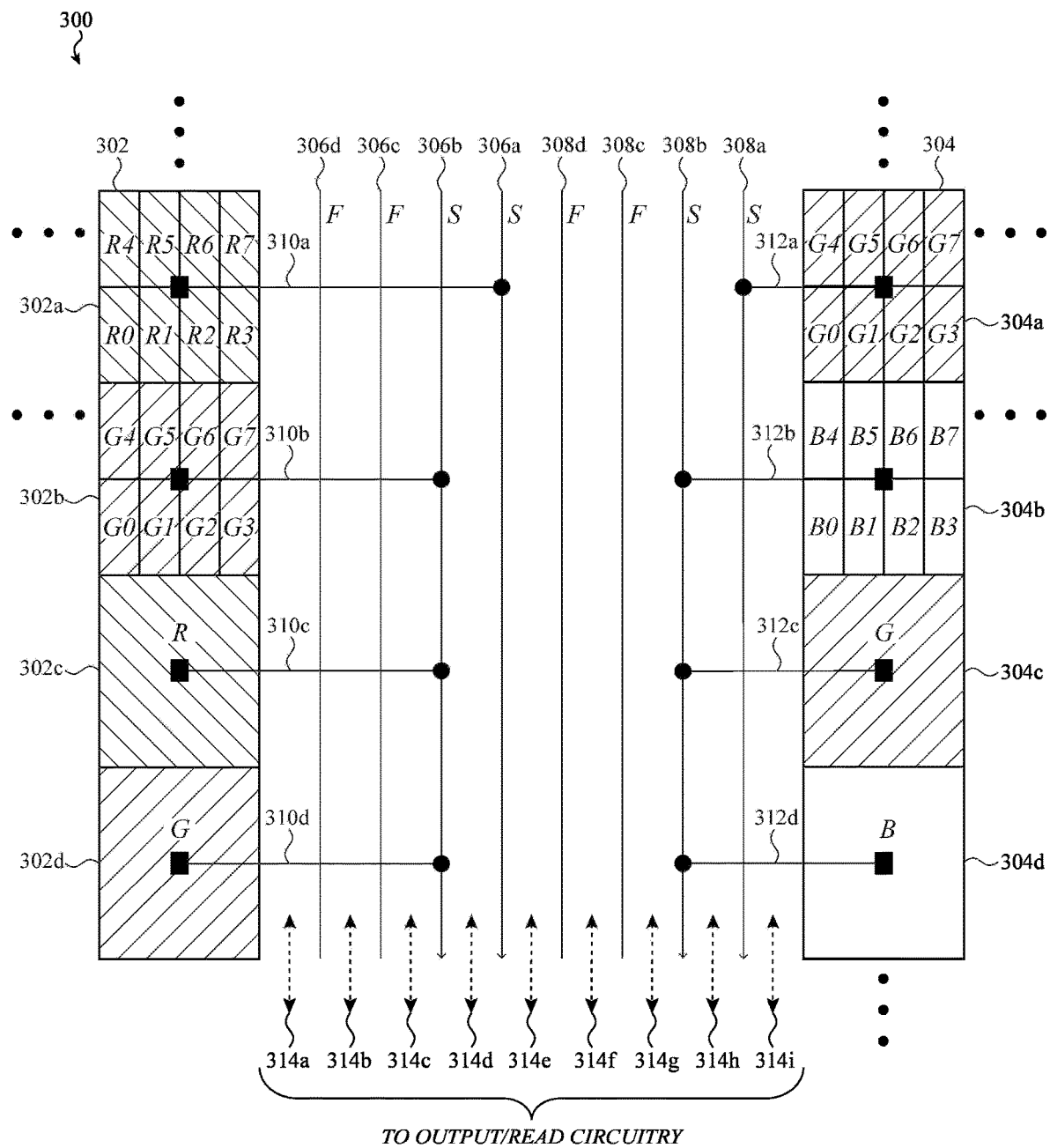
FIG. 3 illustrates a layout of electrical connections positioned with or between columns of a color pixel array.

FIG. 3 illustrates a configuration of a part of a pixel array 300 that includes electrical signal lines, including the output signal lines (OSLs), from left to right: 306d, 306c, 306b, and 306a connected to respective pixels of the left column of pixels 302, and OSLs 308d, 308c, 308b, and 308a connected to respective pixels of the right pixel column 304. Also, there are ground lines 314a, 314b, 314c, 314d, 314e, 314f, 314g, 314h, and 314i. The ground lines 314a-i are interlaced with the OSLs 306a-d and 308a-d so that each of the OSLs 306a-d and 308a-d has a ground line adjacent to its left and right. FIG. 3 shows a part of two columns of pixels 302 and 304 of the pixel array 300: the left column of pixels 302 containing pixels 302a, 302b, 302c, and 302d; and the right column of pixels 304 containing pixels 304a, 304b, 304c, and 304d. One skilled in the art will understand that pixel arrays may contain more columns of pixels, and that such columns may contain more than the illustrated number of pixels. For clarity of illustration, the OSLs 306a-d, 308a-d and ground lines 314a-i are shown positioned in a pixel-free region of the pixel array between the two adjacent pixel columns 302 and 304. However, one skilled in the art will recognize that one or more of the OSLs 306a-d, 308a-d and/or ground lines 314a-i may be positioned atop or below either of one or both the pixel columns 302 and 304, such as for efficiency of layout of the elements or components of the pixel array. For the configuration of the pixel array 300, and subsequent configurations of the embodiments described below, the term "associated electrical signal lines" will be used to refer to OSLs positioned with or between two columns of pixels of a pixel array, and to ground lines that provide shielding to such OSLs.

The pixel array 300 may be a component in an image sensor configured to receive color information or images. The left column of pixels 302 of the pixel array 300 is configured with pixels 302a-d that alternate between those implemented to receive, or respond primarily to, red light (pixels 302a and 302c) and those configured to receive, or respond primarily to, green light (pixels 302b and 302d). Such color reception may be implemented by color filters or lenses proximate to the light receiving surfaces of the respective pixels. The right column of pixels 304 is configured with pixels 304a-d that alternate between those pixels configured to receive, or respond primarily to, green light (pixels 304a and 304c) and those configured to receive, or respond primarily to, blue light (pixels 304b and 304d). In other pixel arrays, a different color pattern may be used for the pixels of a pixel array.

In the shown configuration of the pixel array 300, pixel 302a contains multiple internal subpixel elements R0, R1, R2, R3, R4, R5, R6, and R7, one or more of which may be configured, such as with a color filter or lens, to detect or respond primarily to red light. The internal subpixel elements R0, R1, R2, R3, R4, R5, R6, and R7 may contain one or more light gathering components and associated transistors, such as described in relation to FIG. 2A, or may have another structure. The subpixel elements R0, R1, R2, R3, R4, R5, R6, and R7 of pixel 302a may each be used separately as individual pixels in a light gathering operation (e.g., during a bright light image capture event), or may operate together as a single pixel, such as by having their respective light-generated charges combined (e.g., during a dim light image capture event). The pixel 302a is connected through the connection line 310a to the OSL 306a. Similarly, the pixel 302b may have multiple internal subpixel elements G0, G1, G2, G3, G4, G5, G6 and G7 with structures and functions analogous to those of R0, R1, R2, R3, R4, R5, R6, and R7. The pixel 302b connects to OSL 306b through the connection line 310b. The pixels 302c and 302d may also have internal subpixel elements with analogous structures and functions, but which are not shown for simplicity of discussion. The pixels 302c and 302d respectively connect to through connection lines 310c and 310d to OSL 306b. Similarly, in the right pixel column 304, the pixel 304a, implemented to receive or respond primarily to green light, and pixel 304b, implemented to receive or respond primarily to blue light, may also have subpixel elements as just described, as also may pixels 304c and 304d, though such subpixel elements are not shown for pixels 304c and 304d. The pixel 304a connects through connection line 312a to OSL 308a, and pixels 304b-d respectively connect through connection lines 312b-d to OSL 308b.

One type of row read operation is indicated in FIG. 3, in which at least two parallel rows of pixels of the pixel array 300 have their pixels' output signals received (or just "pixels read") concurrently. As illustrated, the row of pixel array 300 containing pixels 302a and 304a has those pixels' output signals (S) read onto respective OSLs 306a and 308a. Concurrently, the row of pixel array 300 containing pixels 302c and 304c has those pixels' output signals (S) read onto respective OSLs 306b and 308b. During such a concurrent row read operation, the OSLs, 306d, 306c, 308d and 308c, may not be in use and may be configured or biased to have a floating voltage (F). A floating voltage may, in one example, be accomplished by setting any electrical component to which the OSL is connected to have a high input and/or output impedance, though the OSL may still be connected to a voltage source through the high impedance. In a subsequent row read operation, the OSLs, 306d, 306c, 308d and 308c, may be used to receive pixel output signals of pixels in other rows of the pixel array 300. In such a subsequent row read operation, the OSLs 306a, 306b, 308b, and 308a may be put at a floating voltage.

During the concurrent row read operation, the ground lines 314c, 314d, and 314e may provide shielding, for example, to prevent interference between the pixel output signals on OSLs 306b and 306a. A mutual capacitance between an output signal line and an adjacent ground line increases as the spacing between the two decreases. Such stray capacitances may inhibit the associated settling time of a voltage on an OSL at the end of a pixel read operation. As described herein, the signals of the OSLs 306a-d, the OSLs 308a-d, and the ground lines 314a-i may connect to output/read circuitry (not shown).

Figure 4:
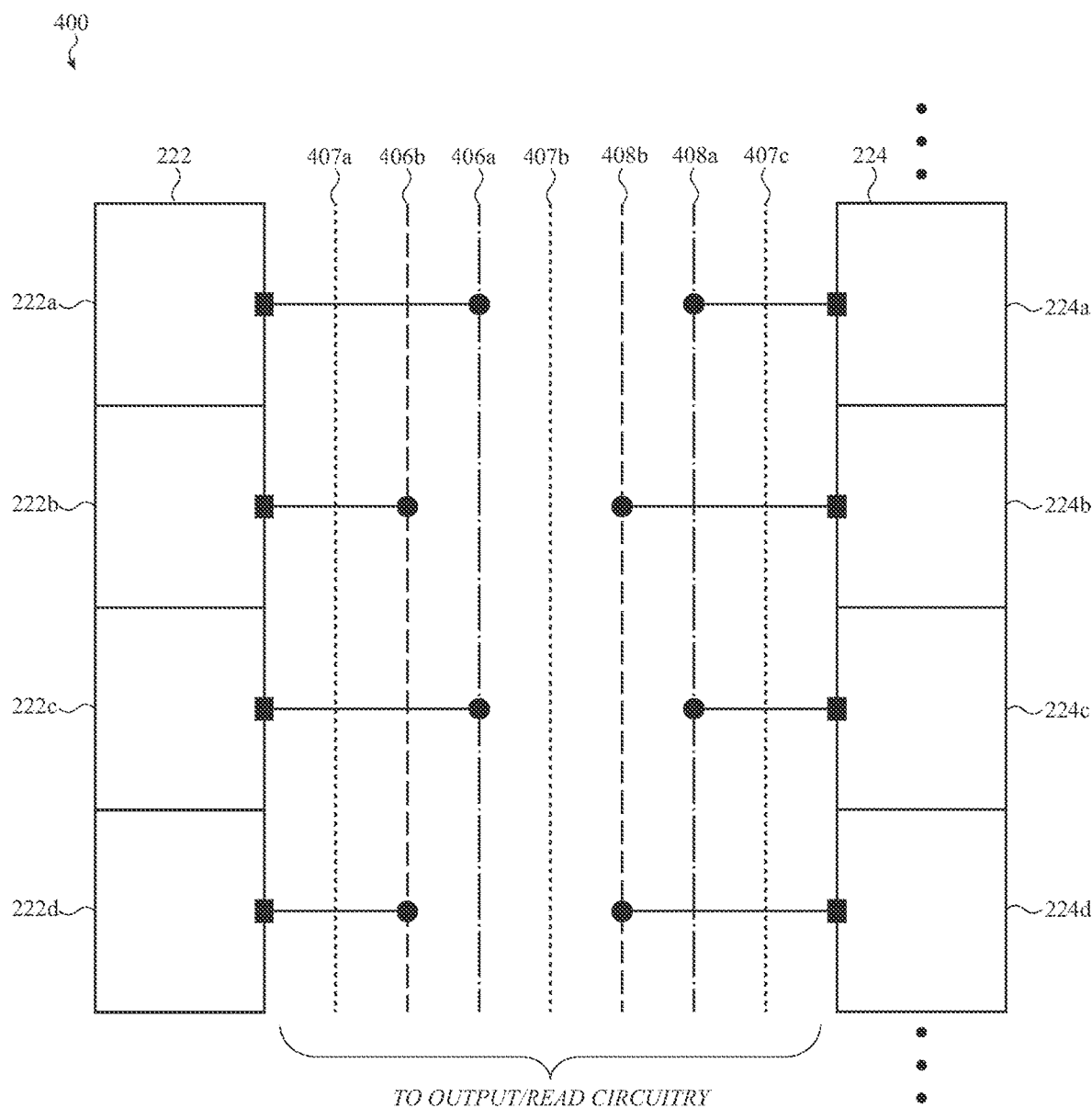
FIG. 4 illustrates an alternative layout of electrical connections positioned with or between columns of pixels, according to an embodiment.

FIG. 4 shows an embodiment of a section of a pixel array 400 containing two pixel columns 222 and 224 and the connection diagram for their associated electrical signal lines (output signal lines and ground lines) 406a-b, 408a-b and 407a-c, such as may be used in an image sensor or other electronic device. The embodiment of the pixel array 400 shown in FIG. 4 uses a reduced set of associated electrical signal lines compared to the pixel array with the configuration 220 shown in FIG. 2B. The pixel array 400 may have reduced stray capacitance between the associated electrical signal lines 406a-b, 408a-b and 407a-c, by having fewer ground lines than are present in the configuration 220 of FIG. 2B.

The section of the pixel array shown in FIG. 4 shows a left column of pixels 222 with pixels 222a, 222b, 222c, and 222d, and a right column of pixels 224 with pixels 224a, 224b, 224c, and 224d, which may be as described in relation to FIG. 2B. In the embodiment of the pixel array 400 of FIG. 4, the associated electrical signal lines include two pairs of adjacent output signal lines (OSLs): the adjacent OSLs 406a and 406b forming the first pair, and the adjacent OSLs 408a and 408b forming the second pair. In the embodiment of FIG. 4, there is no ground line interposed between adjacent OSLs 406a and 406b. Similarly, there is no ground line interposed between adjacent OSLs 408a and 408b. There is a first ground line 407a interposed between the column of pixels 222a-d and the OSL 406b of the first pair of OSLs. The first ground line 407a may provide shielding between voltages within any of the pixels 222a-d and a pixel output signal (such as a voltage) carried on either OSL 406a or 406b. Similarly, there is a second ground line 407c interposed between the column of pixels 224a-d and the OSL 408a. Further, there is a third ground line 407b interposed between the first pair of OSLs 406a-b and the second pair of OSLs 408a-b, as shown interposed between OSLs 406a and 408b. In the embodiment shown in FIG. 4, the electrical signal lines 406a-b, 408a-b, and 407a-c extend parallel to the two adjacent columns of pixels.

The pixels of the left and right pixel columns 222 and 224 may be configured to be responsive to specific colors, such as the pixels described in relation to FIG. 3, or may be responsive to a wider range of light frequencies, such as all or most visible light frequencies. In the former case, color filters or lenses may be used to provide a color filter array pattern. The latter case may, for example, be used in pixel arrays designed to capture black and white images, or other cases of electronic devices having pixel arrays in which only the total light intensity received at a pixel is desired.

The pixel array 400 having the reduced configuration diagram may be part of an electronic device, such as an image sensor or image capture device. In addition to including the pixel array 400, such electronic devices may include electronic control systems or subsystems that control operations of the pixel array, and receive and process the pixel output signals. Examples of such control processing operations include, but are not limited to, applying various input signals to the pixels of the pixel array, applying signals on certain of the OSLs 406a-b and 408a-b, and performing ADC operations on the pixel output signal, as described in relation to FIGS. 6 and 7. The electronic control system may be part of a single unit that includes the pixel array 400, or it may be a separate component system or subsystem within the electronic device.

One operation that may be performed or controlled by an electronic control system is a row read operation on the pixel array 400, in which the row of the pixel array 400 containing pixels 222a and 224a are concurrently selected and have their pixel output signals received onto the respective OSLs 406a and 408a. The lack of a ground line interposed between the OSLs 406a and 406b allows for the OSL 406b, which does not receive a pixel output signal (or "unused") during the row read operation, to be set at an initial voltage, or be configured (or "biased") to have a floating voltage, (or just "float"). Configuring the voltage on the OSL 406b to float may be accomplished by removing any voltage sources (such as other pixels connected to the OSL 406b) connected to the OSL 406b other than one voltage source with high input impedance or output impedance. This may be accomplished by configuring such voltage sources to have high input or output impedance. Similarly, the OSL 408b may be unused in the row read operation and also set at an initial voltage, or allowed to have a floating voltage. At the conclusion of a transmission of the pixel output signal onto the OSL 406a, a low voltage pulse may be applied to the OSL 406b. Because there is no shielding ground line interposed between OSLs 406a and 406b, the low voltage on OSL 406b may reduce the time of settling or leveling off of the voltage on the OSL 406a. The detailed signaling for such a row read operation is presented in more detail below with respect to FIGS. 6 and 7.

Figure 5A:
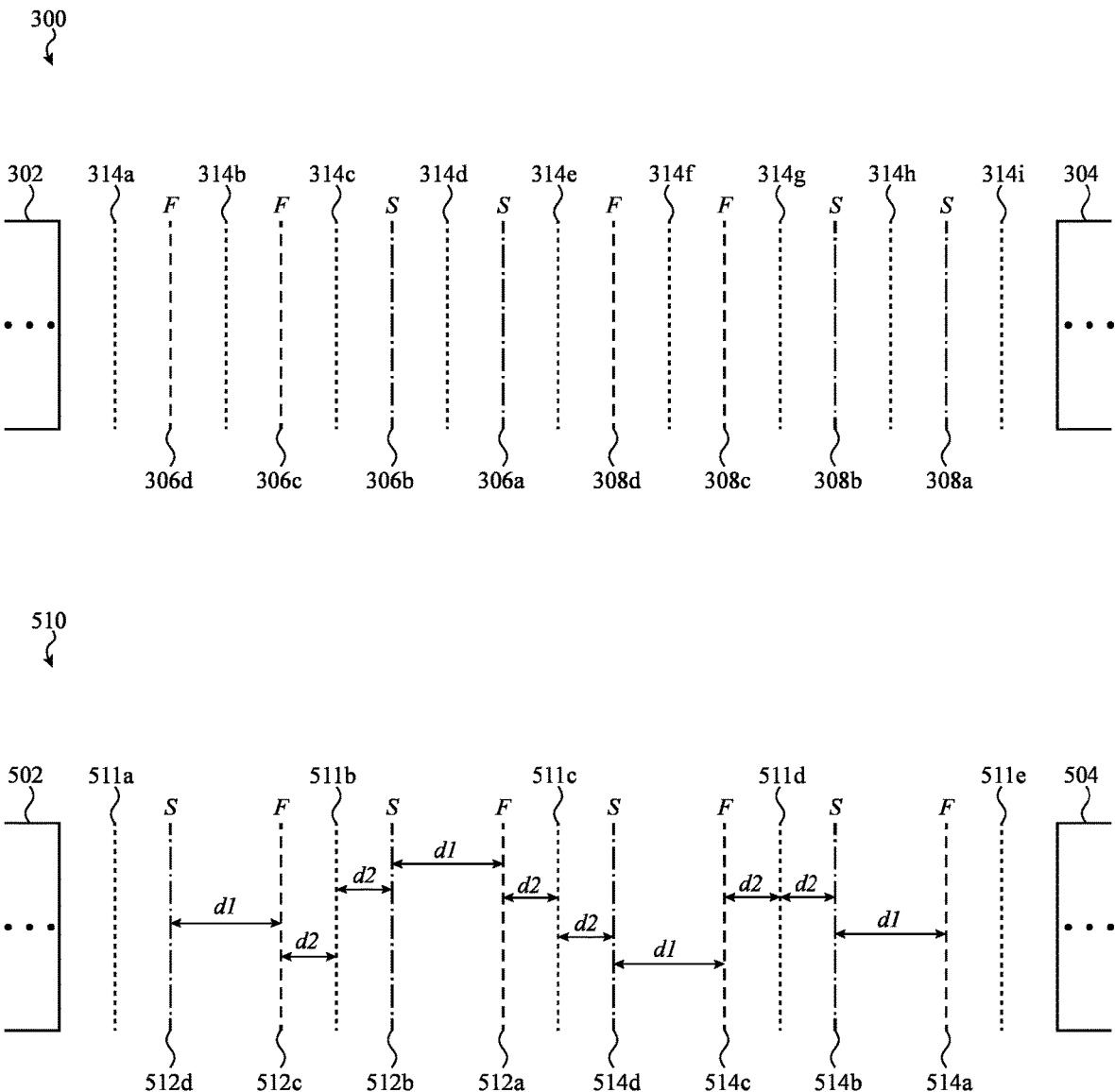
FIG. 5A illustrates an alternative to the layout of electrical connections of FIG. 3 to an embodiment of electrical connections positioned with or between two columns of pixels in a pixel array.

FIG. 5A shows a first embodiment of a configuration 510 of a section of a pixel array with associated electrical signal lines shown positioned with or between two adjacent pixel columns 502 and 504. For comparison purposes, the configuration of the associated electrical signal lines of the pixel array 300 as described in relation to FIG. 3 is included in FIG. 5A above the configuration 510. The embodiment of a pixel array with the configuration 510 has four pairs of adjacent output signal lines (OSLs) for which there is no intervening ground line: (from left to right) a first pair of OSLs 512*d* and 512*c*, a second pair of OSLs 512*b* and 512*a*, a third pair of OSLs 514*d* and 514*c*, and a fourth pair of OSLs 514*b* and 514*a*. As previously described, one or more of the OSLs of the four pairs of adjacent OSLs 512*a-b*, 512*c-d*, 514*a-b*, and 514*c-d*, or of the ground lines 511*a-e*, may be positioned atop or below either of the two adjacent pixel columns 502 and 504, but that for clarity of presentation all are shown positioned in a pixel-free region between the two adjacent pixel columns 502 and 504. The pixel columns 502 and 504 may have the same configuration of pixels as described in relation to FIG. 3. In some embodiments, the pixel columns 502 and 504 may be part of a pixel array with the Bayer color filter array pattern described in relation to FIG. 3. Alternatively, the pixel columns 502 and 504 may be part of a pixel array with an alternative color filter array pattern, or may be part of a pixel array without a color filter array pattern. Connection lines from the pixels of the pixel columns 502 and 504 to the four pairs of OSLs 512*a-b*, 512*c-d*, 514*c-d*, and 514*a-b* are not shown for clarity of explanation. The connection lines from the pixels of the pixel column 502 to respective OSLs of the OSLs 512*a-d*, and the connection lines from the pixels of the pixel column 504 to respective OSLs of the OSLs 514*a-d* may be the same as for the configuration of the connection lines of the pixels 302*a-d* and 304*a-d* to the respective OSLs of the OSLs 306*a-d*, and 308*a-d*, or may have an alternative connection configuration.

In the configuration 510, the four pairs of OSLs 512*c-d*, 512*a-b*, 514*c-d*, and 514*a-b*, and the ground lines 511*a*, 511*b*, 511*c*, 511*d*, and 511*e* are positioned with or between, and in parallel with the direction of, the two pixel columns 502 and 504. The ground line 511*a* may provide shielding between the pixel column 502 and the first pair of OSLs 512*d-c*, the ground line 511*b* may provide shielding between the first pair of OSLs 512*d-c* and the second pair of OSLs 512*b-a*, the ground line 511*c* may provide shielding between the second pair of OSLs 512*b-a* and the third pair of OSLs 514*c-d*, the ground line 511*d* may provide shielding between the third pair of OSLs 514*c-d* and the fourth pair of OSLs 514*a-b*, and the ground line 511*e* may provide shielding between the fourth pair of OSLs 514*a-b* and the pixel column 504.

In the configuration 510, there is a first distance d1 separating the OSLs within each of the four pair of OSLs 512*a-b*, 512*c-d*, 514*d-c*, and 514*b-a*. A different distance d2 separates each of the ground lines 511*b-d* from each of the two OSLs to which it is adjacent. In some embodiments the distance d1 is greater than the distance d2.

Figure 6:
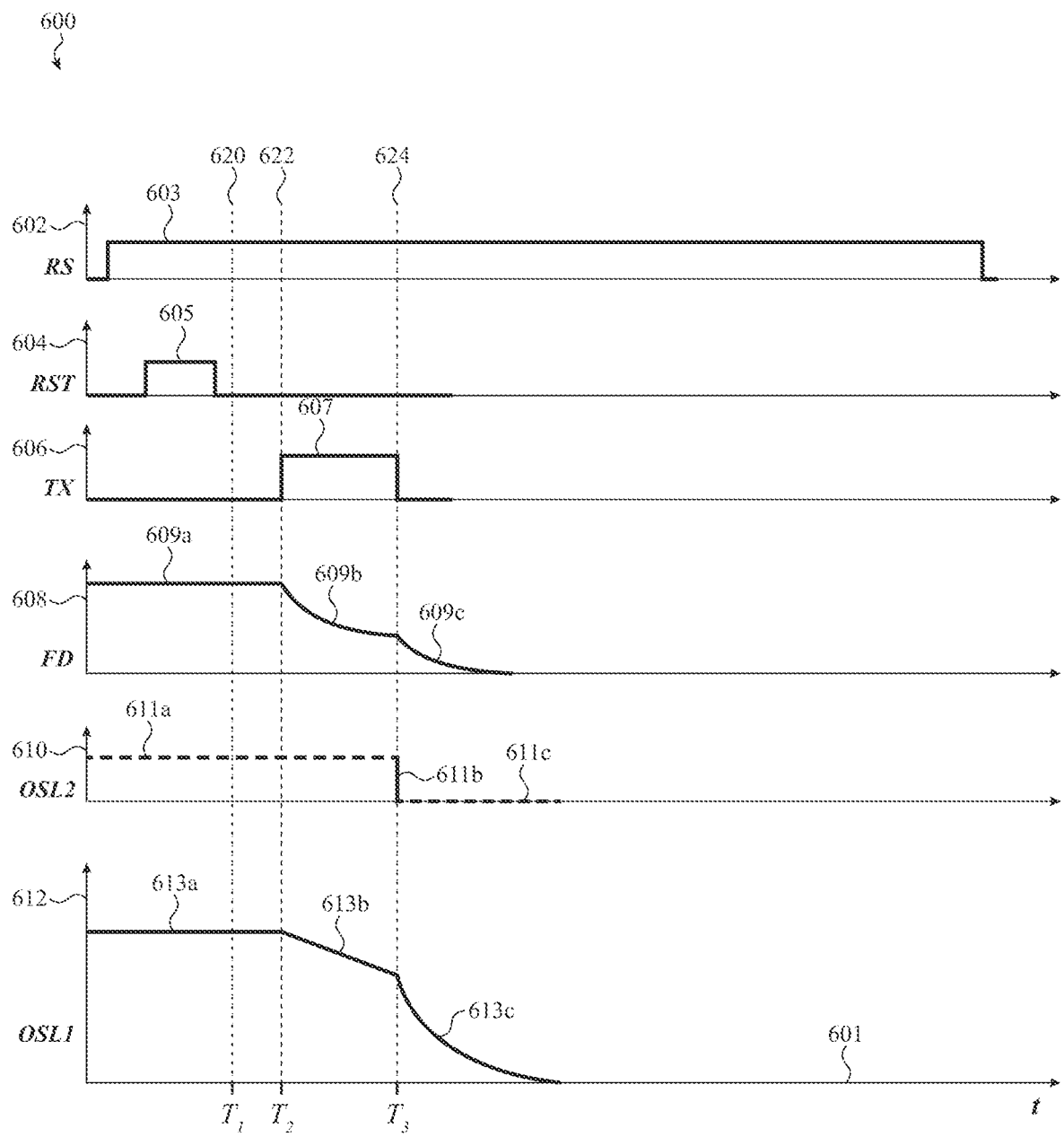
FIG. 6 is a timing diagram for certain signals within a pixel array, according to an embodiment.
Figure 7:
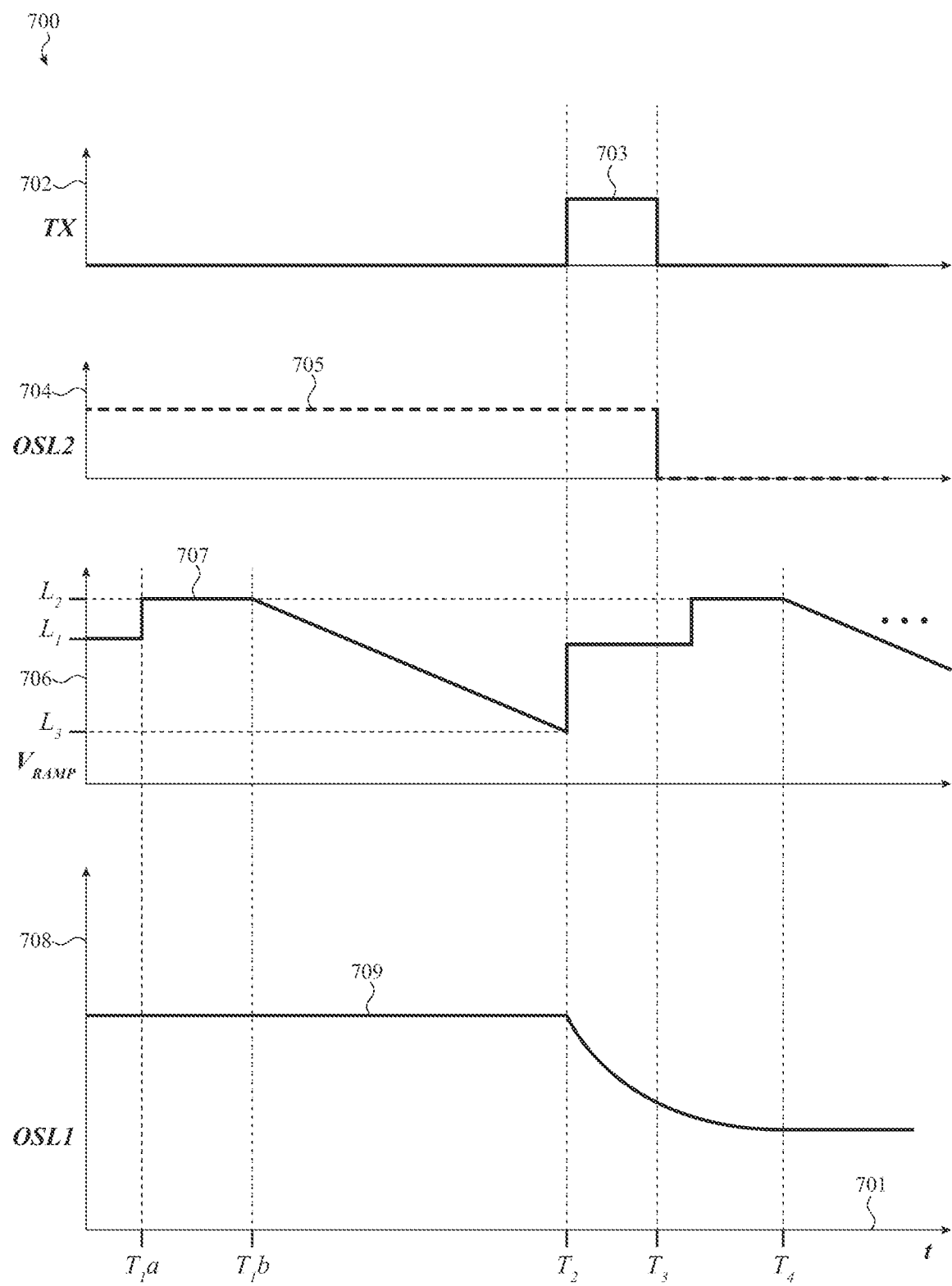
FIG. 7 is a timing diagram for certain signals within a pixel array, according to an embodiment.

In the configuration 510, within each of the four pairs of OSLs 512*c-d*, 512*a-b*, 514*c-d*, and 514*a-b*, during at least a time interval during a row read operation, one of the OSLs therein may be reserved to have a floating voltage (F), as described in relation to FIGS. 6 and 7. As shown in the configuration 510, OSLs 512*c*, 512*a*, 514*c*, and 514*a* may be set at a floating voltage (F), for at least a part of the row read operation. The remaining OSL within each of the four pairs of OSLs 512*a-b*, 512*c-d*, 514*c-d*, and 514*a-b*, then may be used to carry a pixel output signal (S) during the row read operation. As indicated in the configuration 510, during a row read operation, the two pairs of OSLs 512*a-b* and 512*c-d* are used to receive pixel output signals (S) from pixels of the pixel column 502 or have a floating voltage (F), and the two pairs of OSLs 514*a-b* and 514*c-d*, are used to receive pixel output signals (S) from pixels of the pixel column 504 or have a floating voltage (F). Further, in a subsequent row read operation, the OSL within a pair of adjacent OSLs that is set at the floating voltage during the first row read operation may be switched to carry a pixel output signal in the subsequent row read operation.

Figure 5B:
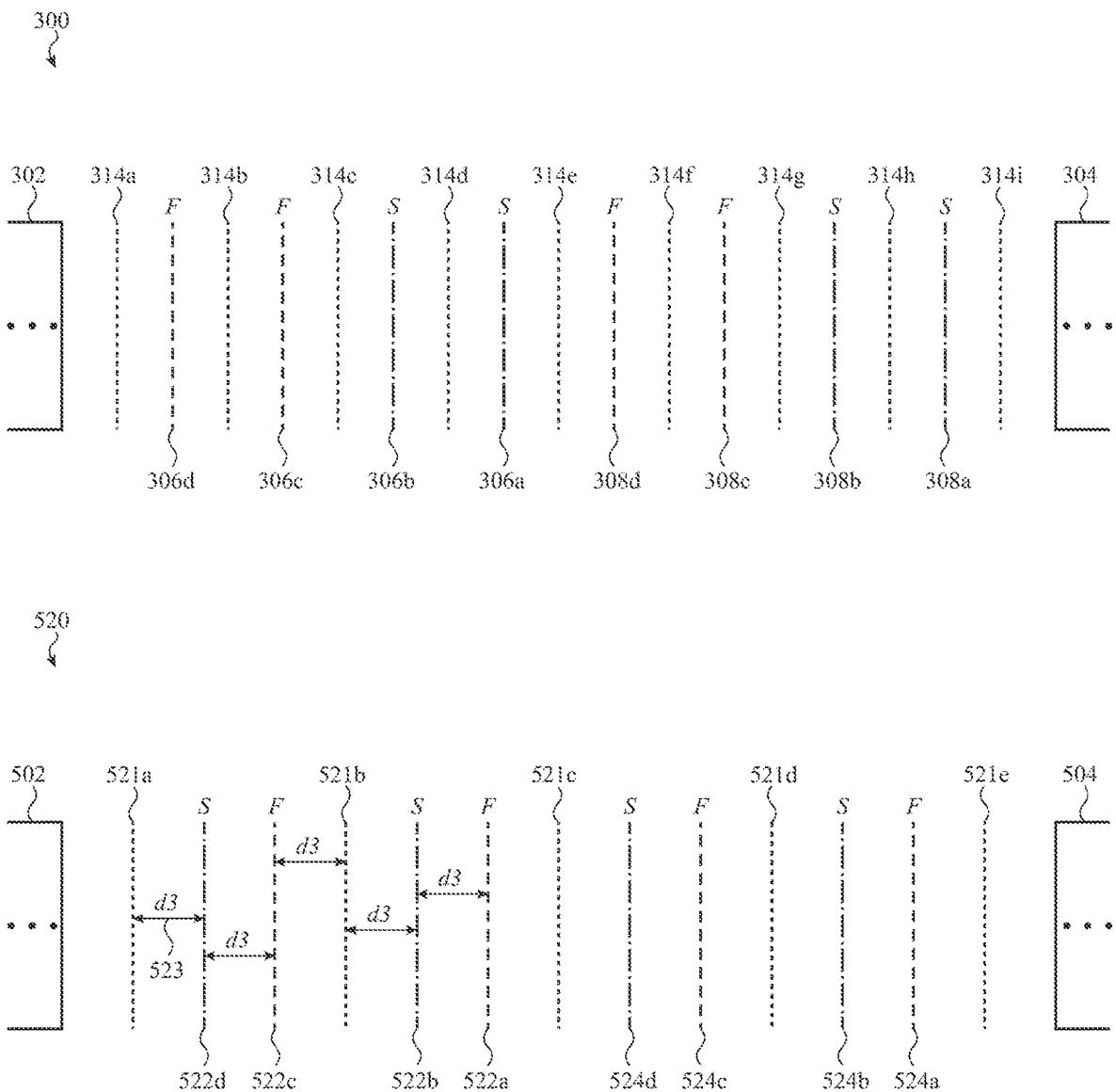
FIG. 5B illustrates an alternative to the layout of electrical connections of FIG. 3 to an embodiment of electrical connections positioned with or between two columns of pixels in a pixel array.

FIG. 5B shows a second embodiment of a configuration 520 of a section of a pixel array having associated electrical signal lines positioned with or between the two adjacent pixel columns 502 and 504 of a pixel array. For comparison purposes, the configuration of the electrical signal lines of the pixel array 300 as described in relation to FIG. 3 is included in FIG. 5B above the configuration 520. There are four pairs of adjacent OSLs, shown from left to right: a first pair with OSLs 522*d* and 522*c*, a second pair with OSLs 522*b* and 522*a*, a third pair with OSLs 524*d* and 524*c*, and a fourth pair with OSLs 524*b* and 524*a*, and the ground lines 521*a*, 521*b*, 521*c*, 521*d*, and 521*e* positioned in parallel with the direction of the two pixel columns 502 and 504. Similar to the configuration 510 of FIG. 5A, the ground line 521*b* may provide shielding between the first pair of OSLs 522*c-d* and the second pair of OSLs 522*a-b*, the ground line 521*c* may provide shielding between the second pair of OSLs 522*a-b* and the third pair of OSLs 524*c-d*, and the ground line 521*d* may provide shielding between the third pair of OSLs 524*c-d* and the fourth pair of OSLs 524*a-b*. The ground line 521*a* may provide shielding between the pixel column 502 and the first pair of OSLs 522*c-d*, and the ground line 521*e* may provide shielding between the fourth pair of OSLs 524*a-b* and the second pixel column 504.

The configuration 520 differs from the configuration 510 at least in that there is common distance d3 523 separating any two adjacent electrical signal lines (the OSLs 522*a-b*, 522*c-d*, 524*a-b*, 524*c-d*, and the ground lines 521*a*-521*e*).

The signaling pattern(s) during a row read operation described for the configuration 510 may be used with the configuration 520.

FIG. 6 shows a timing diagram 600 of control, input, and output signals of an embodiment that may be applied to, or arise from, a pixel of a pixel array, during an embodiment of a row read operation. The embodiment shown differs from the timing signals of FIG. 2C: in this embodiment and related variations, a first output signal line (OSL1) of a pair of adjacent output signal lines is used to receive an output signal from the pixel while a second output signal line (OSL2) of the pair of adjacent output signal lines is initially unused and may initially be configured to have a floating voltage but may subsequently receive a pull-down pulse. The particular control, timing, and output signals may relate to the pixel 202 described with respect to FIG. 2A, or to a pixel having an alternative structure. Timing events shown on the time axis 601 apply to the horizontal axis of each of the signal axes 602, 604, 606, 608, 610, and 612 described below. For simplicity of description, the vertical axis of each of the signal axes 602, 604, 606, 608, 610, and 612 described will be presumed to be a voltage axis, but one skilled in the art will recognize that the one or more of the signals' values may have other units, for example, current values.

The exemplary row-select (RS) signal 603 shown on the row-select signal axes 602 initiates the row read operation by switching to a high voltage level (or just switching 'high'). For the pixel 202 of FIG. 2A, the row-select signal 603 is applied to the gate of the output transistor 212. The actual high voltage level may depend on the particular semiconductor technology used for the pixel array. Further, in alternative embodiments, an alternative row-select signal may initiate a row read operation by switching to a negative voltage level from a low voltage level, or to a low voltage level from a high voltage level. The row-select signal 603 remains high for the duration of the row read operation. The row-select signal 603 may be applied to multiple pixels in the same row of the pixel array for a concurrent row read operation of output signals from multiple pixels in the same row of the pixel array. Further, the row-select signal 603 may be applied to pixels in multiple rows currently in cases in which the pixel array has sufficiently many OSLs positioned with or between columns, such as described in relation to FIGS. 3, 5A, and 5B.

After initiation of the row read operation, a reset signal 605 (RST) is applied to the pixel, as shown on the reset axis signal 604. The reset signal 605 may serve to clear residual charges from a previous light exposure, such as in the FD node 208 of the pixel 202. The exemplary reset signal 605 is a level voltage pulse signal, though this is not required.

After the end of the reset signal 605, at a time T1 620, a first analog-to-digital conversion (ADC) may be performed on the pixel's first output signal line's (OSL1) signal 613a, shown on the OSL1 signal axis 612. The first ADC may be performed by components of an electronic control system that may be either on the same semiconductor chip as the pixel array, or on a separate (e.g., logic circuitry) chip to which the pixel array is connected.

After the conclusion of the first ADC, at time T2 622, a signal transfer pulse 607 TX, shown on the transmit signal axis 606, is applied to the pixel to allow movement of charge from the pixel's photodiode to a storage location in the pixel, such as the FD node 208 of pixel 202.

As a result, the pixel's resulting FD node voltages 609a, 609b, and 609c, shown on the FD node voltage axis 608, varies over time. After the reset signal 605, and before the time $T_2$ 622 when the signal transfer pulse 607 begins, a first FD node voltage 609a is at a first voltage level, which may be related to a supply voltage of the pixel. After initiation of the charge transfer at the rising edge of the signal transfer pulse 607 at time $T_2$ 622, the second FD node voltage 609b falls for the duration of the signal transfer pulse 607. At the conclusion of the signal transfer pulse 607, the third FD node voltage 609c falls to a low voltage level.

As a result of the signal transfer pulse 607, the pixel's output may be received as a first output signal line's OSL1 voltage signals 613a, 613b, and 613c, as shown on the OSL1 signal axis 612. After completion of the reset signal 605 at time T1 620, but before the start time $T_2$ 622 of the signal transfer pulse 607, the OSL1 voltage signal 613a may have a voltage related to the reset first FD node voltage 609a. After the time $T_2$ 622, the OSL1 voltage 613b follows the decrease of the second FD node voltage 609b. After the end time $T_3$ 624 of the signal transfer pulse 607, the OSL1 voltage 613c settles to a low voltage level. Though shown settling to the time axis, one skilled in the art will recognize that a settling voltage level need not be a zero voltage; it may be related to the charge transferred to the FD node (such as FD node 208 of pixel 202).

In the embodiment of a row read operation with the signaling operations of the timing diagram 600, the second output signal line (OSL2) may be used to decrease the settling time of OSL1 voltage 613c. As shown on the OSL2 signal axis 610, a first OSL2 voltage 611a may be a floating voltage level, in which OSL2 is not connected to a supply voltage, a ground voltage, or another voltage source. The OSL2 may, prior to the start of the row select signal 603, have been connected to a high voltage source and then disconnected (e.g., by a transistor being switched to a high impedance state) from the high voltage source.

During a pull-down time interval containing the end time $T_3$ 624 of the signal transfer pulse 607, the OSL2 may be connected to a low voltage source to cause the OSL2 voltage signal 611b to have a low voltage. After the end of the pull-down time interval, the OSL2 voltage signal 611c may be allowed to have a floating voltage, or may be kept connected to the low voltage source. The pull-down time interval may be only a small percentage of the duration of the signal transfer pulse 607 and may begin prior to the falling edge at the time $T_3$ 624 and conclude at subsequent time $T_3$ 624. Alternatively, the pull-down time interval may begin with the falling edge of the signal transfer pulse 607 at time $T_3$ 624.

Once the OSL1 voltage 613c has settled, a second ADC may be performed on the OSL1 voltage 613c. The difference in values of the first and second ADCs may be used to estimate an amount of light-generated charges received at the photodiode of the pixel, such as pixel 202, during an image capture operation by an image sensor or electronic device containing the pixel array.

FIG. 7 shows a timing diagram 700 of some of the control, input, and output signals that may be applied to, or arise from, the pixel of the pixel array, during the embodiment of a row read operation described in relation to FIG. 6, as well as another control signal $V_{RAMP}$ shown on the $V_{RAMP}$ axis 706. The time axis 701 of the first output signal line (OSL1) axis 708 applies to the transmit signal axis 702, the second output signal lines (OSL2) axis 704, and the $V_{RAMP}$ axis 706.

The transmit (TX) signal 703 on the transmit signal axis 702 may be as described for the signal transfer pulse 607. The signal transfer pulse 703 may be a voltage pulse signal with a rising edge from a low voltage level to a high voltage level at the time T2, and returning to a low voltage level at time $T_3$.

The second output signal line (OSL2) voltage signal 705, shown on the OSL2 axis 704, is as described in relation to FIG. 6. The OSL2 voltage signal 705 may have a floating voltage until a pull-down time interval containing, or proximate to, the falling edge of the signal transfer pulse 703. During the pull-down time interval, a low voltage level is applied to the OSL2. After the pull-down time interval, the OSL2 voltage signal 705 may be either a floating voltage or may continue to have an applied low voltage.

The OSL1 voltage signal 709 may have a first, approximately constant, value from the start of the row read operation up to the time T2 at the start of the signal transfer pulse 703. Thereafter, the OSL1 voltage signal 709 falls due to charge transfer from the pixel's photodiode to the pixel's storage location, such as the FD node 208 of the pixel 202. At the end of the signal transfer pulse 703 at time $T_3$, the OSL1 voltage signal 709 settles to a second value by the time $T_4$.

The $V_{RAMP}$ signal 707 shown on the $V_{RAMP}$ axis 706 may be one signal input to an analog-to-digital converter, which has the OSL1 voltage signal 709 as another input. For example, both the $V_{RAMP}$ signal 707 and the OSL1 voltage signal 709 may be inputs to a comparator that is a component of a ramp-compare analog-to-digital converter. At time $T_{1a}$, the $V_{RAMP}$ signal 707 rises from value $L_1$ to value L value $L_2$, expected to be above a high voltage on the OSL1. At time $T_{1b}$, the first ADC starts with the $V_{RAMP}$ signal 707 beginning a linear decrease to the level $L_3$ at the time $T_2$, at which time the first ADC is completed and the $V_{RAMP}$ signal 707 returns to a high level in preparation for the second ADC. At time $T_2$ the signal transfer pulse 703 may occur.

Though shown concurrently with the end of the first ADC, the rising edge of the signal transfer pulse 703 may begin after the end of the first ADC at time $T_2$. At time $T_4$, the $V_{RAMP}$ signal 707 again decreases linearly to start the second ADC.

Figure 8:
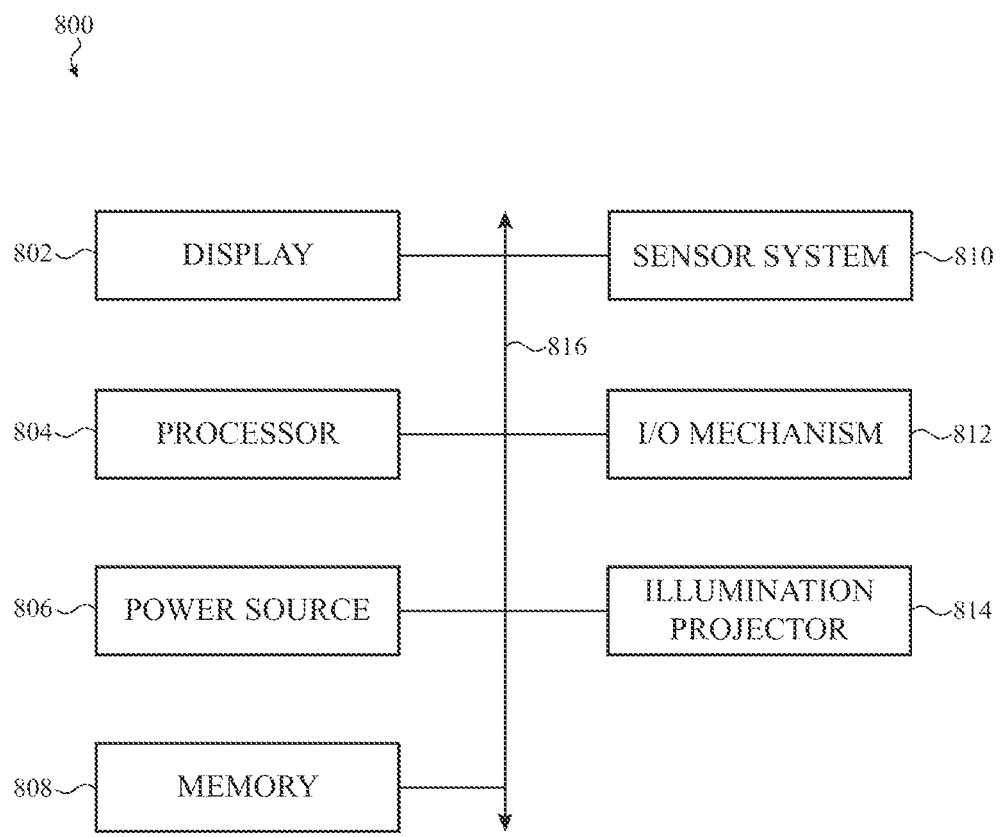
FIG. 8 shows an example block diagram of an electronic device that may incorporate one or more embodiments.

FIG. 8 shows an example block diagram of an electronic device 800, which in some cases may be the electronic device described with reference to FIGS. 1A and 1B, or another type of electronic device including one or more of the image sensors having one or more pixel arrays as described herein. The electronic device 800 may include an electronic display 802 (e.g., a light-emitting display), a processor 804, a power source 806, a memory 808 or storage device, a sensor system 810, an input/output (I/O) mechanism 812 (e.g., an input/output device, input/output port, or haptic input/output interface), and/or an illumination projector 814. The processor 804 may control some or all of the operations of the electronic device 800. The processor 804 may communicate, either directly or indirectly, with some or all of the other components of the electronic device 800. For example, a system bus, other bus(es), or other communication mechanism 816 can provide communication between the electronic display 802, the processor 804, the power source 806, the memory 808, the sensor system 810, the I/O mechanism 812, and the illumination projector 814.

The processor 804 may be implemented as any electronic device capable of processing, receiving, or transmitting data or instructions, whether such data or instructions is in the form of software or firmware or otherwise encoded. For example, the processor 804 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some cases, the processor 804 may provide part or all of the processing system or processor described herein.

It should be noted that the components of the electronic device 800 can be controlled by multiple processors. For example, select components of the electronic device 800 (e.g., the sensor system 810) may be controlled by a first processor and other components of the electronic device 800 (e.g., the electronic display 802) may be controlled by a second processor, where the first and second processors may or may not be in communication with each other.

The power source 806 can be implemented with any device capable of providing energy to the electronic device 800. For example, the power source 806 may include one or more batteries or rechargeable batteries. Additionally or alternatively, the power source 806 may include a power connector or power cord that connects the electronic device 800 to another power source, such as a wall outlet.

The memory 808 may store electronic data that can be used by the electronic device 800. For example, the memory 808 may store electrical data or content such as, for example, audio and video files, documents and applications, device settings and user preferences, timing signals, control signals, instructions, and/or data structures or databases. The memory 808 may include any type of memory. By way of example only, the memory 808 may include random access memory, read-only memory, Flash memory, removable memory, other types of storage elements, or combinations of such memory types.

The electronic device 800 may also include one or more sensor systems 810 positioned almost anywhere on the electronic device 800. The sensor system(s) 810 may be configured to sense one or more types of parameters, such as but not limited to, vibration; light; touch; force; heat; movement; relative motion; biometric data (e.g., biological parameters) of a user; air quality; proximity; position; connectedness; surface quality; and so on. By way of example, the sensor system(s) 810 may include a heat sensor, a position sensor, a light or optical sensor, a self-mixing interferometry (SMI) sensor, an image sensor (e.g., one or more of the image sensors or cameras described herein), an accelerometer, a pressure transducer, a gyroscope, a magnetometer, a health monitoring sensor, an air quality sensor, and so on. Additionally, the one or more sensor systems 810 may utilize any suitable sensing technology, including, but not limited to, interferometric, magnetic, capacitive, ultrasonic, resistive, optical, acoustic, piezoelectric, or thermal technologies.

In particular, the sensor system(s) 810 of the electronic device 800 may include one or more cameras or other types of image sensors that include pixel arrays as described herein, and which may be operated or controlled, such as by the processor 804, by the methods described herein in relation FIGS. 6 and 7.

The I/O mechanism 812 may transmit or receive data from a user or another electronic device. The I/O mechanism 812 may include the electronic display 802, a touch sensing input surface, a crown, one or more buttons (e.g., a graphical user interface "home" button), one or more microphones or speakers, one or more ports such as a microphone port, and/or a keyboard. Additionally or alternatively, the I/O mechanism 812 may transmit electronic signals via a communications interface, such as a wireless, wired, and/or optical communications interface. Examples of wireless and wired communications interfaces include, but are not limited to, cellular and Wi-Fi communications interfaces.

The illumination projector 814 may be configured as described with reference to FIGS. 1A and 1B and elsewhere herein, and in some cases may be integrated or used in conjunction with one or more of the sensor system(s) 810. For example, the illumination projector 814 may illuminate an object or scene, and light that reflects or scatters from the object or scene may be sensed by a light or optical sensor, an SMI sensor, or an image sensor (e.g., one or more of the image sensors or cameras described herein). In some embodiments, an illumination projector 814 may be part of a sensor system 810.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

What is claimed is:

1. A method of performing a row read operation of a pixel array of an image sensor, the pixel array including at least a first and a second pixel column, a first and a second pair of adjacent output signal lines (OSLs) positioned with or between and parallel to the first and second pixel columns, a first ground line interposed between the first and second pair of adjacent OSLs, a second ground line interposed between the first pixel column and the first pair of adjacent OSLs, and a third ground line interposed between the second pair of adjacent OSLs and the second pixel column, the method comprising:
applying an initial voltage to a first OSL of the first pair of adjacent OSLs during the row read operation;
subsequent to applying the initial voltage, configuring a voltage of the first OSL of the first pair of adjacent OSLs to float;
while the voltage of the first OSL of the first pair of adjacent OSLs floats, applying a signal transfer pulse to a first pixel of the first pixel column;
receiving a pixel output signal of the first pixel of the first pixel column on a second OSL of the first pair of adjacent OSLs; and
applying a low voltage signal to the first OSL of the first pair of adjacent OSLs during a pull-down time interval containing a falling edge of the signal transfer pulse.

2. The method of performing a row read operation of claim 1, further comprising:
subsequent to applying the low voltage signal, configuring the first OSL of the first pair of adjacent OSLs to float.

3. The method of claim 1, further comprising:
applying the initial voltage to a first OSL of the second pair of adjacent OSLs;
subsequent to applying the initial voltage to the first OSL of the second pair of adjacent OSLs, configuring a voltage of the first OSL of the second pair of adjacent OSLs to float;
applying the signal transfer pulse to a first pixel of the second pixel column;
receiving a pixel output signal of the first pixel of the second pixel column on a second OSL of the second pair of adjacent OSLs; and
also applying the low voltage signal to the first OSL of the second pair of adjacent OSLs during the pull-down time interval containing the falling edge of the signal transfer pulse.

4. The method of claim 3, further comprising:
subsequent to applying the low voltage signal to the first OSL of the second pair of adjacent OSLs, configuring the voltage of the first OSL of the second pair of adjacent OSLs to floating.

5. The method of claim 1, further comprising:
applying a reset signal to the first pixel of the first pixel column prior to applying the signal transfer pulse;
performing a first analog-to-digital conversion of the pixel output signal on the second OSL of the first pair of adjacent OSLs prior to a rising edge of the signal transfer pulse;
performing a second analog-to-digital conversion of the pixel output signal on the second OSL of the first pair of adjacent OSLs subsequent to the signal transfer pulse; and
estimating an amount of light-generated charge at the first pixel of the first pixel column using the first and second analog-to-digital conversions.

6. The method of claim 5, wherein the first and second analog-to-digital conversions are performed by an electronic control system of the image sensor, the electronic control system linked with the pixel array.

7. The method of claim 1, wherein the low voltage signal is a ground voltage.

8. The method of claim 1, wherein the low voltage signal is a voltage below ground voltage.

9. An electronic device, comprising:
a pixel array; and
an electronic control system operably linked with the pixel array;
wherein:
the pixel array includes:
a first pixel column and a second pixel column adjacent to the first pixel column;
a set of associated electrical signal lines positioned with or between the first and second pixel columns, comprising:
a first pair of adjacent output signal lines (OSLs);
a second pair of adjacent OSLs interposed between the first pair of adjacent OSLs and the second pixel column;
a first ground line interposed between the first pixel column and the first pair of adjacent OSLs;
a second ground line interposed between the first pair of adjacent OSLs and the second pair of adjacent OSLs; and
a third ground line interposed between the second pair of adjacent OSLs and the second pixel column; and
the electronic control system is operable to apply a row read operation to the pixel array, the row read operation comprising:
applying an initial voltage value to a first OSL of the first pair of adjacent OSLs;
applying a signal transfer pulse to a pixel in the first pixel column;
receiving on a second OSL of the first pair of adjacent OSLs a pixel output signal of the pixel in the first pixel column; and
applying a low voltage pulse to the first OSL of the first pair of adjacent OSLs during a pull-down time interval containing a falling edge of the signal transfer pulse.

10. The electronic device of claim 9, wherein the row read operation further comprises:
performing a first analog-to-digital conversion of the received pixel output signal of the pixel in the first pixel column prior to a rising edge of the signal transfer pulse;
performing a second analog-to-digital conversion of the received pixel output signal of the pixel in the first pixel column subsequent to the falling edge of the signal transfer pulse; and
calculating a value of light-generated charge induced in the pixel in the first pixel column using the first and second analog-to-digital conversions.

11. The electronic device of claim 9, wherein the first and second pairs of adjacent OSLs and the first, second, and third ground lines are positioned parallel to the first and second pixel columns.

12. The electronic device of claim 11, wherein any adjacent two electrical signal lines of the set of associated electrical signal lines are separated by a common distance.

13. The electronic device of claim 11, wherein:
the first pair of adjacent OSLs are separated by a first distance;
the second pair of adjacent OSLs are separated by the first distance;
each of the first, second, and third ground lines is separated from any adjacent OSL by a second distance; and
the second distance is less than the first distance.

14. An image sensor comprising:
a pixel array having a color filter array pattern, the pixel array comprising:
a first column of pixels;

a second column of pixels adjacent and parallel to the first column of pixels; and a set of associated electrical signal lines positioned with or between the first column of pixels and the second column of pixels and extending parallel to the first column of pixels, the set of associated electrical signal lines comprising:
  four pairs of adjacent output signal lines (OSLs);
  a first ground line interposed between the first column of pixels and a first pair of adjacent OSLs;
  a second ground line interposed between the first pair of adjacent OSLs and a second pair of adjacent OSLs;
  a third ground line interposed between the second pair of adjacent OSLs and a third pair of adjacent OSLs;
  a fourth ground line interposed between the third pair of adjacent OSLs and a fourth pair of adjacent OSLs; and
  a fifth ground line interposed between the fourth pair of adjacent OSLs and the second column of pixels; and an electronic control system linked with the set of associated electrical signal lines of the pixel array and configured to selectively float or bias a first OSL in a pair of adjacent OSLs while receiving a pixel output signal of a pixel in the first column of pixels on a second OSL in the pair of adjacent OSLs.

15. The image sensor of claim 14, wherein the electronic control system is further configured to charge the first OSL of the first pair of adjacent OSLs to an initial voltage prior to configuring the first OSL of the first pair of adjacent OSLs to float.

16. The image sensor of claim 14, wherein the electronic control system is further configured to:
  apply to the pixel of the first column of pixels a signal transfer pulse to initiate the receiving of the pixel output signal on the second OSL of the first pair of adjacent OSLs; and
  apply a low voltage pulse to the first OSL of the first pair of adjacent OSLs during a pull-down time interval containing a falling edge of the signal transfer pulse.

17. The image sensor of claim 16, wherein the electronic control system is further configured to:
  selectively float or bias a first OSL of the third pair of adjacent OSLs prior to the application of the signal transfer pulse;
  apply the signal transfer pulse to a pixel of the second column of pixels to initiate receiving a pixel output signal of the pixel of the second column of pixels on a second OSL of the third pair of adjacent OSLs; and
  apply the low voltage pulse to the first OSL of the third pair of adjacent OSLs during the pull-down time interval containing the falling edge of the signal transfer pulse.

18. The image sensor of claim 17, wherein:
the pixel of the first column of pixels is a first pixel of the first column of pixels;
the pixel of the second column of pixels is a first pixel of the second column of pixels; and
the electronic control system is further configured to:
  selectively float or bias a first OSL of the second pair of adjacent OSLs prior to the application of the signal transfer pulse;
  selectively float or bias a first OSL of the fourth pair of adjacent OSLs prior to the application of the signal transfer pulse;
  apply the signal transfer pulse to a second pixel of the first column of pixels to initiate receiving a pixel output signal of the second pixel of the first column of pixels on the second OSL of the second pair of adjacent OSLs;
  apply the signal transfer pulse to a second pixel of the second column of pixels to initiate receiving a pixel output signal of the second pixel of the second column of pixels on the second OSL of the fourth pair of adjacent OSLs;
  apply the low voltage pulse to the first OSL of the second pair of adjacent OSLs during the pull-down time interval containing the falling edge of the signal transfer pulse; and
  apply the low voltage pulse to the first OSL of the fourth pair of adjacent OSLs during the pull-down time interval containing the falling edge of the signal transfer pulse.

19. The image sensor of claim 14, wherein each adjacent pair of the set of associated electrical signal lines are separated by a common distance.

20. The image sensor of claim 14, wherein:
a first distance separates the OSLs within each of the four pairs of adjacent OSLs;
a second distance separates each of the first, second, third, fourth, and fifth ground lines from each OSL to which it is adjacent; and
the second distance is less than the first distance.

* * * * *